(12) United States Patent
Naraine et al.

(10) Patent No.: US 12,301,171 B2
(45) Date of Patent: *May 13, 2025

(54) POWER AMPLIFIER ANTENNA STRUCTURE

(71) Applicant: Skyworks Solutions, Inc., Irvine, CA (US)

(72) Inventors: Patrick Marcus Naraine, Irvine, CA (US); William J. Domino, Yorba Linda, CA (US); Serge Francois Drogi, Flagstaff, AZ (US); René Rodríguez, Rancho Santa Margarita, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/239,631

(22) Filed: Aug. 29, 2023

(65) Prior Publication Data
US 2024/0063757 A1     Feb. 22, 2024

Related U.S. Application Data

(63) Continuation of application No. 17/198,753, filed on Mar. 11, 2021, now Pat. No. 11,784,611, which is a
(Continued)

(51) Int. Cl.
*H03F 1/02* (2006.01)
*H01Q 9/04* (2006.01)
(Continued)

(52) U.S. Cl.
CPC ......... *H03F 1/0288* (2013.01); *H01Q 9/0407* (2013.01); *H03F 3/195* (2013.01); *H03F 3/213* (2013.01)

(58) Field of Classification Search
CPC .................................. H03F 1/02; H03F 1/07
(Continued)

(56) References Cited

U.S. PATENT DOCUMENTS

| 5,712,592 A | 1/1998 | Stimson et al. |
| 6,731,172 B2 | 5/2004 | Thompson |

(Continued)

FOREIGN PATENT DOCUMENTS

| CN | 102460828 | 5/2012 |
| CN | 102577103 | 7/2012 |
| CN | 107112952 | 8/2017 |

OTHER PUBLICATIONS

International Search Report and Written Opinion for International Application No. PCT/US2019/036814 dated Oct. 4, 2019, in 9 pages.

*Primary Examiner* — Henry Choe
(74) *Attorney, Agent, or Firm* — Knobbe, Martens, Olson & Bear, LLP

(57) ABSTRACT

Integrated Doherty power amplifiers are provided herein. In certain implementations, a Doherty power amplifier includes a carrier amplification stage that generates a carrier signal, a peaking amplification stage that generates a peaking signal, and an antenna structure that combines the carrier signal and the peaking signal. The antenna structure radiates a transmit wave in which the carrier signal and the peaking signal are combined with a phase shift.

20 Claims, 22 Drawing Sheets

Related U.S. Application Data continuation of application No. 16/432,387, filed on Jun. 5, 2019, now Pat. No. 10,972,055.

(60) Provisional application No. 62/685,489, filed on Jun. 15, 2018.

(51) Int. Cl.
*H03F 3/195* (2006.01)
*H03F 3/213* (2006.01)

(58) Field of Classification Search
USPC .............................. 330/124 R, 295
See application file for complete search history.

(56) References Cited

U.S. PATENT DOCUMENTS

| | | | |
|---|---|---|---|
| 6,731,173 B1 | 5/2004 | Thompson | |
| 6,917,246 B2 | 7/2005 | Thompson | |
| 8,005,445 B2 | 8/2011 | Kuriyama et al. | |
| 9,007,142 B1 | 4/2015 | Ozard | |
| 9,071,211 B1 | 6/2015 | Ozard | |
| 9,450,541 B2 | 9/2016 | Beltran et al. | |
| 9,461,596 B1 | 10/2016 | Ozard | |
| 9,467,115 B2 | 10/2016 | Lyalin | |
| 9,692,357 B2 | 6/2017 | Hoang et al. | |
| 9,712,119 B2 | 7/2017 | Datta et al. | |
| 9,742,365 B1 | 8/2017 | Ozard et al. | |
| 9,774,300 B2 | 9/2017 | Jin et al. | |
| 9,800,207 B2 | 10/2017 | Datta et al. | |
| 9,806,681 B2 | 10/2017 | Lehtola | |
| 9,853,610 B2 | 12/2017 | Beltran et al. | |
| 9,912,298 B2 | 3/2018 | Lyalin et al. | |
| 9,912,299 B2 | 3/2018 | Lyalin | |
| 9,923,523 B2 | 3/2018 | Lehtola | |
| 9,935,594 B2 | 4/2018 | Lehtola | |
| 10,110,183 B2 | 10/2018 | Lyalin et al. | |
| 10,291,185 B2 | 5/2019 | Lyalin et al. | |
| 10,305,437 B2 | 5/2019 | Ozard et al. | |
| 10,355,647 B2 | 7/2019 | Datta et al. | |
| 10,903,182 B1* | 1/2021 | Wang | H03F 3/211 |
| 10,972,055 B2 | 4/2021 | Naraine et al. | |
| 11,196,138 B1* | 12/2021 | Ahmed | H03F 1/3241 |
| 11,784,611 B2 | 10/2023 | Naraine et al. | |
| 11,984,429 B2* | 5/2024 | Wei | H01L 24/49 |
| 2004/0085134 A1 | 5/2004 | Griffith et al. | |
| 2006/0139091 A1 | 6/2006 | Fratti | |
| 2008/0125061 A1 | 5/2008 | Kuriyama et al. | |
| 2010/0001802 A1 | 1/2010 | Blednov | |
| 2010/0176880 A2 | 7/2010 | Dupuy et al. | |
| 2012/0235734 A1 | 9/2012 | Pengelly | |
| 2013/0120061 A1 | 5/2013 | Van Der et al. | |
| 2015/0091667 A1 | 4/2015 | Seneviratne et al. | |
| 2015/0119107 A1 | 4/2015 | Bouny | |
| 2016/0190997 A1* | 6/2016 | Tanimoto | H03F 3/24 330/295 |
| 2018/0278214 A1 | 9/2018 | Jin et al. | |
| 2019/0097585 A1 | 3/2019 | Lehtola | |
| 2019/0149099 A1 | 5/2019 | Lehtola | |
| 2019/0158046 A1 | 5/2019 | Lehtola | |
| 2019/0165738 A1 | 5/2019 | Pan et al. | |
| 2019/0165739 A1 | 5/2019 | Lyalin et al. | |
| 2019/0386617 A1 | 12/2019 | Naraine et al. | |
| 2021/0203280 A1 | 7/2021 | Naraine et al. | |
| 2024/0072740 A1* | 2/2024 | Kim | H01L 24/26 |

\* cited by examiner

POWER AMPLIFIER ANTENNA STRUCTURE

CROSS-REFERENCE TO RELATED APPLICATIONS

Any and all applications for which a foreign or domestic priority claim is identified in the Application Data Sheet, or any correction thereto, are hereby incorporated by reference under 37 CFR 1.57.

BACKGROUND

Technical Field

Embodiments of the invention relate to electronic systems, and in particular, to radio frequency (RF) electronics.

Description of Related Technology

A communication system can include a transceiver, a front end, and one or more antennas for wirelessly transmitting and/or receiving signals. The front end can include low noise amplifier(s) for amplifying relatively weak signals received via the antenna(s), and power amplifier(s) for boosting signals for transmission via the antenna(s).

Examples of communication systems include, but are not limited to, mobile phones, tablets, base stations, network access points, customer-premises equipment (CPE), laptops, and wearable electronics.

SUMMARY

In certain embodiments, the present disclosure relates to an integrated Doherty power amplifier. The integrated Doherty power amplifier includes a splitting and phase shifting circuit configured to receive a radio frequency input signal, and to output a first radio frequency signal and a second radio frequency signal. The integrated Doherty power amplifier further includes a carrier amplification stage configured to generate a carrier signal based on amplifying the first radio frequency signal, a peaking amplification stage configured to generate a peaking signal based on amplifying the second radio frequency signal, and an antenna structure configured to combine the carrier signal and the peaking signal, and to radiate a transmit wave in which the carrier signal and the peaking signal are combined with a phase shift.

In several embodiments, the antenna structure provides the phase shift.

In a number of embodiments, the integrated Doherty power amplifier further includes an output phase shifter configured to provide at least a portion of the phase shift.

In various embodiments, the first radio frequency signal and the second radio frequency signal have about equal power and a phase difference of about ninety degrees.

In some embodiments, the antenna structure includes a first port configured to receive the carrier signal and a second port configured to receive the peaking signal. According to several embodiments, the carrier amplification stage matches into an impedance of the first port, and the peaking amplification stage matches into an impedance of the second port. In accordance with a number of embodiments, the first port provides a first impedance transformation, and the second port provides a second impedance transformation different from the first impedance transformation. According to various embodiments, the antenna structure includes a patch antenna element, and an impedance transformer including a feed conductor coupled to the patch antenna element, a first input conductor extending from the feed conductor and including the first port, and a second input conductor extending from the feed conductor and including the second port. In accordance with several embodiments, the antenna structure includes a patch antenna element, and an impedance transformer having a first metal region and a second metal region of different widths, the second metal region connecting the first metal region to the patch antenna element. According to a number of embodiments, the first metal region includes the first port and the second port, the second metal region of narrower width than the first metal region. In accordance with a various embodiments, a distance between the first port and the second port provides a phase shift of about ninety degrees at a frequency of the transmit wave.

In certain embodiments, the present disclosure relates to a mobile device. The mobile device includes a transceiver configured to generate a radio frequency input signal, and a Doherty power amplifier configured to amplify the radio frequency input signal. The Doherty power amplifier includes a carrier amplification stage configured to output a carrier signal and a peaking amplification stage configured to output a peaking signal. The mobile device further includes an antenna structure configured to combine the carrier signal and the peaking signal, and to radiate a transmit wave in which the carrier signal and the peaking signal are combined with a phase shift.

In some embodiments, the antenna structure includes a first port configured to receive the carrier signal and a second port configured to receive the peaking signal. According to a number of embodiments, the first port provides a first impedance transformation, and the second port provides a second impedance transformation different from the first impedance transformation. In accordance with several embodiments, the antenna structure includes a patch antenna element, and an impedance transformer including a feed conductor coupled to the patch antenna element, a first input conductor extending from the feed conductor and including the first port, and a second input conductor extending from the feed conductor and including the second port. According to various embodiments, the antenna structure includes a patch antenna element, and an impedance transformer having a first metal region and a second metal region of different widths, the second metal region connecting the first metal region to the patch antenna element. In accordance with a number of embodiments, the impedance transformer includes a first metal region and a second metal region of different widths, the second metal region connecting the first metal region to the patch antenna element, and the first metal region including the first port and the second port.

In certain embodiments, the present disclosure relates to a radio frequency module. The radio frequency module includes a substrate, and a semiconductor die attached to the substrate and including a Doherty power amplifier configured to amplify a radio frequency input signal. The Doherty power amplifier includes a carrier amplification stage configured to generate a carrier signal and a peaking amplification stage configured to generate a peaking signal. The radio frequency module further includes an antenna structure attached to the substrate and configured to combine the carrier signal and the peaking signal, the antenna structure configured to radiate a transmit wave in which the carrier signal and the peaking signal are combined with a phase shift.

In various embodiments, the antenna structure includes a first port configured to receive the carrier signal and a second port configured to receive the peaking signal. According to a number of embodiments, the first port provides a first impedance transformation, and the second port provides a second impedance transformation different from the first impedance transformation.

In certain embodiments, the present disclosure relates to an integrated Doherty power amplifier. The integrated Doherty power amplifier includes a carrier amplification stage configured to generate a carrier signal based on amplifying a first radio frequency signal, a peaking amplification stage configured to generate a peaking signal based on amplifying a second radio frequency signal, and an antenna including a first port configured to receive the carrier signal and a second port configured to receive the peaking signal, the antenna configured to radiate a transmit wave in which the carrier signal and the peaking signal are combined with a phase shift.

In a number of embodiments, the phase shift is about ninety degrees.

In various embodiments, the carrier amplification stage matches into an impedance of the first port.

In several embodiments, the peaking amplification stage matches into an impedance of the second port.

In some embodiments, the first port provides a first impedance transformation, and the second port provides a second impedance transformation different from the first impedance transformation.

In various embodiments, the integrated Doherty power amplifier further includes a splitter and phase shifter configured to receive a radio frequency input signal, and to output the first radio frequency signal and the second radio frequency signal.

In a number of embodiments, the integrated Doherty power amplifier is implemented in an antenna array.

In some embodiments, the first radio frequency signal and the second radio frequency signal have about equal power and a phase difference of about ninety degrees.

In various embodiments, the antenna comprises a patch antenna, a dipole antenna, a ceramic resonator antenna, a stamped metal antenna, or a laser direct structuring antenna.

In some embodiments, the antenna includes an impedance transformer coupled to a patch antenna element, the impedance transformer including the first port and the second port. According to a number of embodiments, the impedance transformer includes a first metal region and a second metal region of different widths, the second metal region connecting the first metal region to the patch antenna element. In accordance with various embodiments, the first metal region includes the first port and the second port. According to several embodiments, the second metal region is of narrower width than the first metal region. In accordance with a number of embodiments, a distance between the first port and the second port provides a phase shift of about ninety degrees at a frequency of the transmit wave. According to various embodiments, the impedance transformer further includes a ground plane beneath at least a portion of the patch antenna element and/or the impedance transformer. In accordance with several embodiments, the impedance transformer includes a feed conductor coupled to the patch antenna element. According to a number of embodiments, the impedance transform further includes a first input conductor extending from the feed conductor and including the first port. In accordance with various embodiments, the impedance transformer further includes a metal stub extending from the first input conductor. According to several embodiments, the impedance transformer further includes a second input conductor extending from the feed conductor and including the second port. In accordance with a number of embodiments, the impedance transformer further includes a first metal stub extending form the first input conductor and a second metal stub extending from the second input conductor. According to various embodiments, the first input conductor and the second input conductor are of different lengths. In accordance with several embodiments, the first input conductor and the second input conductor are on opposite sides of the feed conductor. According to a number of embodiments, the integrated Doherty power amplifier further includes a ground plane, the impedance transformer positioned between the patch antenna element and the ground plane.

In certain embodiments, the present disclosure relates to a mobile device. The mobile device includes a transceiver configured to generate a radio frequency input signal. The mobile device further includes a Doherty power amplifier configured to amplify the radio frequency input signal, the Doherty power amplifier including a carrier amplification stage configured to generate a carrier signal and a peaking amplification stage configured to generate a peaking signal. The mobile device further includes an antenna including a first port configured to receive the carrier signal and a second port configured to receive the peaking signal, the antenna configured to radiate a transmit wave in which the carrier signal and the peaking signal are combined with a phase shift.

In a number of embodiments, the phase shift is about ninety degrees.

In various embodiments, the carrier amplification stage matches into an impedance of the first port.

In several embodiments, the peaking amplification stage matches into an impedance of the second port.

In some embodiments, the first port provides a first impedance transformation, and the second port provides a second impedance transformation different from the first impedance transformation.

In various embodiments, the Doherty power amplifier further includes a splitter and phase shifter configured to receive a radio frequency input signal, and to output the first radio frequency signal and the second radio frequency signal.

In some embodiments, the first radio frequency signal and the second radio frequency signal have about equal power and a phase difference of about ninety degrees.

In various embodiments, the antenna comprises a patch antenna, a dipole antenna, a ceramic resonator antenna, a stamped metal antenna, or a laser direct structuring antenna.

In some embodiments, the antenna includes an impedance transformer coupled to a patch antenna element, the impedance transformer including the first port and the second port. According to a number of embodiments, the impedance transformer includes a first metal region and a second metal region of different widths, the second metal region connecting the first metal region to the patch antenna element. In accordance with various embodiments, the first metal region includes the first port and the second port. According to several embodiments, the second metal region is of narrower width than the first metal region. In accordance with a number of embodiments, a distance between the first port and the second port provides a phase shift of about ninety degrees at a frequency of the transmit wave. According to various embodiments, the impedance transformer further includes a ground plane beneath at least a portion of the patch antenna element and/or the impedance transformer. In accordance with several embodiments, the impedance transformer includes a feed conductor coupled to the patch antenna element. According to a number of embodiments, the impedance transform further includes a first input conductor extending from the feed conductor and including the first port. In accordance with various embodiments, the impedance transformer further includes a metal stub extending from the first input conductor. According to several embodiments, the impedance transformer further includes a second input conductor extending from the feed conductor and including the second port. In accordance with a number of embodiments, the impedance transformer further includes a first metal stub extending form the first input conductor and a second metal stub extending from the second input conductor. According to various embodiments, the first input conductor and the second input conductor are of different lengths. In accordance with several embodiments, the first input conductor and the second input conductor are on opposite sides of the feed conductor. According to a number of embodiments, the Doherty power amplifier further includes a ground plane, the impedance transformer positioned between the patch antenna element and the ground plane.

In certain embodiments, the present disclosure relates to a radio frequency module. The radio frequency module includes a substrate, and a semiconductor die attached to the substrate and including a Doherty power amplifier configured to amplify a radio frequency input signal. The Doherty power amplifier includes a carrier amplification stage configured to generate a carrier signal and a peaking amplification stage configured to generate a peaking signal. The radio frequency module further includes an antenna including a first port configured to receive the carrier signal and a second port configured to receive the peaking signal, the antenna configured to radiate a transmit wave in which the carrier signal and the peaking signal are combined with a phase shift.

In a number of embodiments, the phase shift is about ninety degrees.

In various embodiments, the carrier amplification stage matches into an impedance of the first port.

In several embodiments, the peaking amplification stage matches into an impedance of the second port.

In some embodiments, the first port provides a first impedance transformation, and the second port provides a second impedance transformation different from the first impedance transformation.

In various embodiments, the Doherty power amplifier further includes a splitter and phase shifter configured to receive a radio frequency input signal, and to output the first radio frequency signal and the second radio frequency signal.

In some embodiments, the first radio frequency signal and the second radio frequency signal have about equal power and a phase difference of about ninety degrees.

In various embodiments, the antenna comprises a patch antenna, a dipole antenna, a ceramic resonator antenna, a stamped metal antenna, or a laser direct structuring antenna.

In various embodiments, the antenna is integrated with the substrate.

In some embodiments, the antenna includes an impedance transformer coupled to a patch antenna element, the impedance transformer including the first port and the second port. According to a number of embodiments, the impedance transformer includes a first metal region and a second metal region of different widths, the second metal region connecting the first metal region to the patch antenna element. In accordance with various embodiments, the first metal region includes the first port and the second port. According to several embodiments, the second metal region is of narrower width than the first metal region. In accordance with a number of embodiments, a distance between the first port and the second port provides a phase shift of about ninety degrees at a frequency of the transmit wave. According to various embodiments, the impedance transformer further includes a ground plane beneath at least a portion of the patch antenna element and/or the impedance transformer. In accordance with several embodiments, the impedance transformer includes a feed conductor coupled to the patch antenna element. According to a number of embodiments, the impedance transform further includes a first input conductor extending from the feed conductor and including the first port. In accordance with various embodiments, the impedance transformer further includes a metal stub extending from the first input conductor. According to several embodiments, the impedance transformer further includes a second input conductor extending from the feed conductor and including the second port. In accordance with a number of embodiments, the impedance transformer further includes a first metal stub extending form the first input conductor and a second metal stub extending from the second input conductor. According to various embodiments, the first input conductor and the second input conductor are of different lengths. In accordance with several embodiments, the first input conductor and the second input conductor are on opposite sides of the feed conductor. According to a number of embodiments, the Doherty power amplifier further includes a ground plane, the impedance transformer positioned between the patch antenna element and the ground plane.

In certain embodiments, an integrated Doherty power amplifier is provided. The integrated Doherty power amplifier includes a carrier amplification stage configured to generate a carrier signal based on amplifying a first radio frequency signal, a peaking amplification stage configured to generate a peaking signal based on amplifying a second radio frequency signal, a first antenna including a first port configured to receive the carrier signal, and a second antenna including a second port configured to receive the peaking signal. The first antenna and the second antenna are configured to operate in combination with one another to radiate a transmit wave in which the carrier signal and the peaking signal are combined with a phase shift.

In a number of embodiments, the phase shift is about ninety degrees.

In various embodiments, the carrier amplification stage matches into an impedance of the first port.

In several embodiments, the peaking amplification stage matches into an impedance of the second port.

In some embodiments, the first port provides a first impedance transformation, and the second port provides a second impedance transformation different from the first impedance transformation.

In various embodiments, the integrated Doherty power amplifier further includes a splitter and phase shifter configured to receive a radio frequency input signal, and to output the first radio frequency signal and the second radio frequency signal.

In a number of embodiments, the integrated Doherty power amplifier is implemented in an antenna array.

In some embodiments, the first radio frequency signal and the second radio frequency signal have about equal power and a phase difference of about ninety degrees.

In various embodiments, the antenna comprises a patch antenna, a dipole antenna, a ceramic resonator antenna, a stamped metal antenna, or a laser direct structuring antenna.

In a number of embodiments, the first antenna radiates a first wave and the second antenna radiates a second wave, the first wave and the second wave configured to combine by constructive interference to generate the transmit wave. According to several embodiments, the first wave and the second wave are configured to combine in the far field to provide the phase shift.

In some embodiments, the first antenna and the second antenna each comprise a patch antenna, a dipole antenna, a ceramic resonator antenna, a stamped metal antenna, or a laser direct structuring antenna.

In certain embodiments, the present disclosure relates to a mobile device including a transceiver configured to generate a radio frequency input signal, and a Doherty power amplifier configured to amplify the radio frequency input signal. The Doherty power amplifier includes a carrier amplification stage configured to generate a carrier signal and a peaking amplification stage configured to generate a peaking signal. The mobile device further includes a first antenna including a first port configured to receive the carrier signal, and a second antenna including a second port configured to receive the peaking signal. The first antenna and the second antenna are configured to operate in combination with one another to radiate a transmit wave in which the carrier signal and the peaking signal are combined with a phase shift.

In a number of embodiments, the phase shift is about ninety degrees.

In various embodiments, the carrier amplification stage matches into an impedance of the first port.

In several embodiments, the peaking amplification stage matches into an impedance of the second port.

In some embodiments, the first port provides a first impedance transformation, and the second port provides a second impedance transformation different from the first impedance transformation.

In various embodiments, the Doherty power amplifier further includes a splitter and phase shifter configured to receive a radio frequency input signal, and to output the first radio frequency signal and the second radio frequency signal.

In some embodiments, the first radio frequency signal and the second radio frequency signal have about equal power and a phase difference of about ninety degrees.

In a number of embodiments, the first antenna radiates a first wave and the second antenna radiates a second wave, and the first wave and the second wave are configured to combine by constructive interference to generate the transmit wave. According to a number of embodiments, the first wave and the second wave are configured to combine in the far field to provide the phase shift.

In several embodiments, the first antenna and the second antenna each comprise a patch antenna, a dipole antenna, a ceramic resonator antenna, a stamped metal antenna, or a laser direct structuring antenna.

In certain embodiments, the present disclosure relates to a radio frequency module. The radio frequency module includes a substrate, and a semiconductor die attached to the substrate and including a Doherty power amplifier configured to amplify a radio frequency input signal. The Doherty power amplifier includes a carrier amplification stage configured to generate a carrier signal and a peaking amplification stage configured to generate a peaking signal. The radio frequency module further includes an antenna including a first port configured to receive the carrier signal and a second port configured to receive the peaking signal, the antenna configured to radiate a transmit wave in which the carrier signal and the peaking signal are combined with a phase shift.

In a number of embodiments, the phase shift is about ninety degrees.

In various embodiments, the carrier amplification stage matches into an impedance of the first port.

In several embodiments, the peaking amplification stage matches into an impedance of the second port.

In some embodiments, the first port provides a first impedance transformation, and the second port provides a second impedance transformation different from the first impedance transformation.

In various embodiments, the Doherty power amplifier further includes a splitter and phase shifter configured to receive a radio frequency input signal, and to output the first radio frequency signal and the second radio frequency signal.

In some embodiments, the first radio frequency signal and the second radio frequency signal have about equal power and a phase difference of about ninety degrees.

In certain embodiments, the first antenna radiates a first wave and the second antenna radiates a second wave, and the first wave and the second wave are configured to combine by constructive interference to generate the transmit wave. According to a number of embodiments, the first wave and the second wave are configured to combine in the far field to provide the phase shift.

In various embodiments, the first antenna and the second antenna each comprise a patch antenna, a dipole antenna, a ceramic resonator antenna, a stamped metal antenna, or a laser direct structuring antenna.

In several embodiments, the first antenna and the second antenna are integrated with the substrate.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
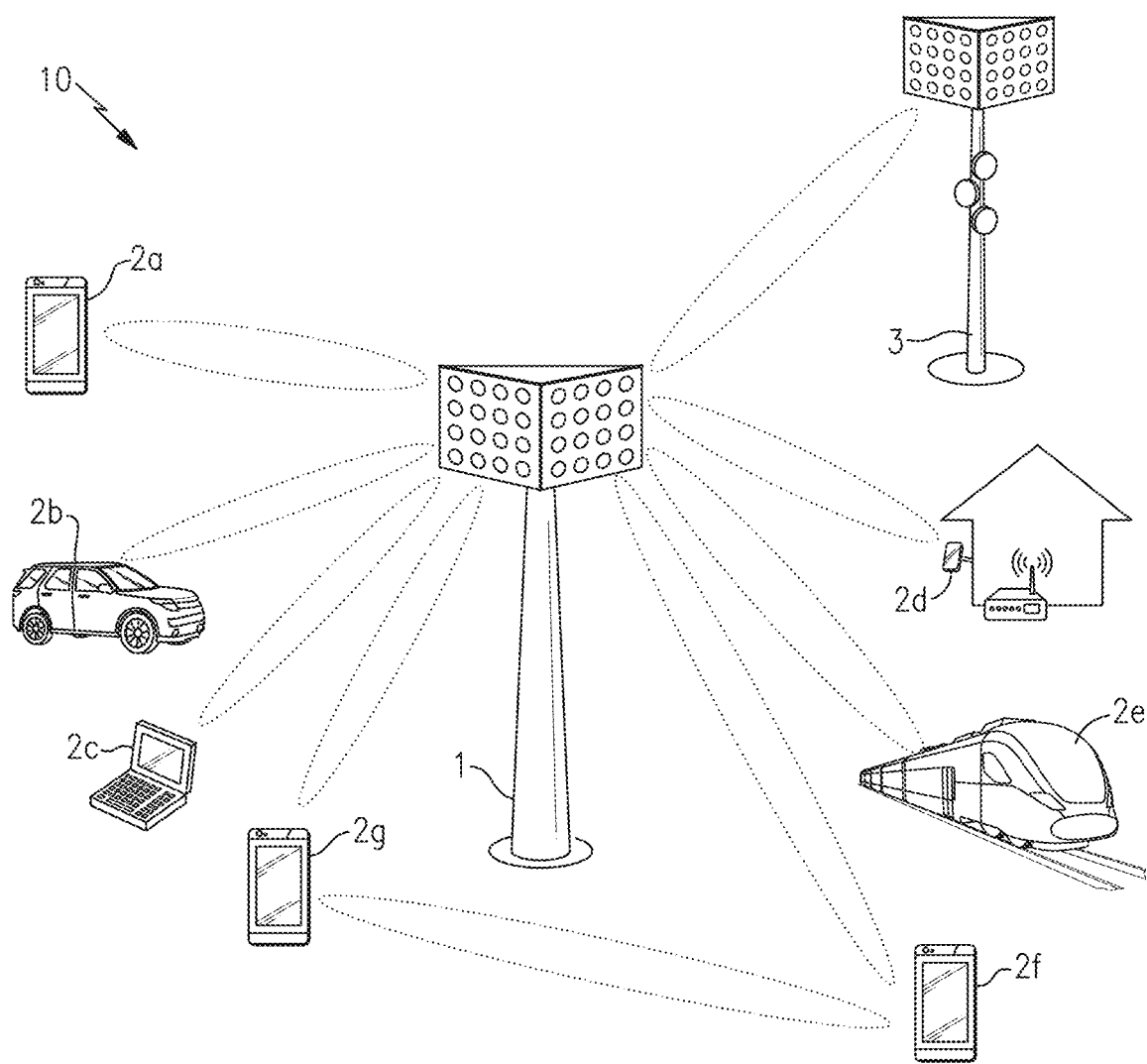
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
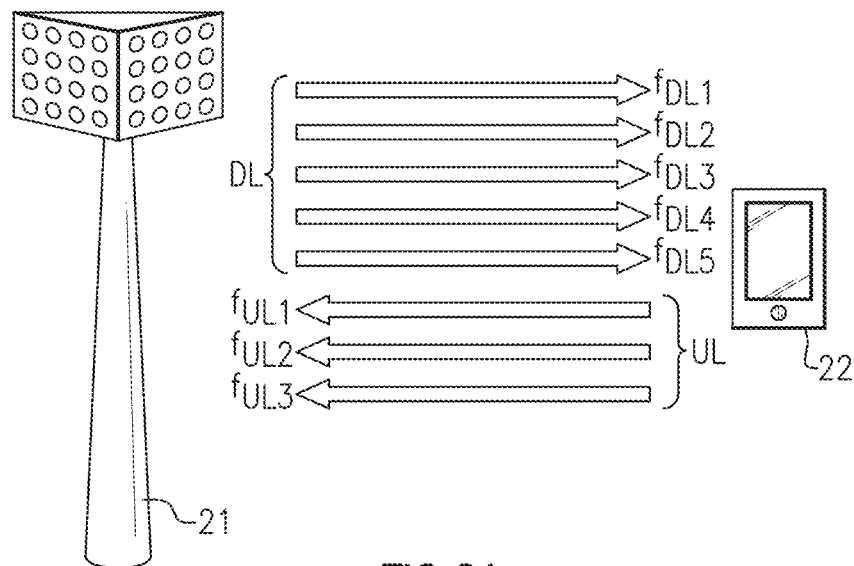
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
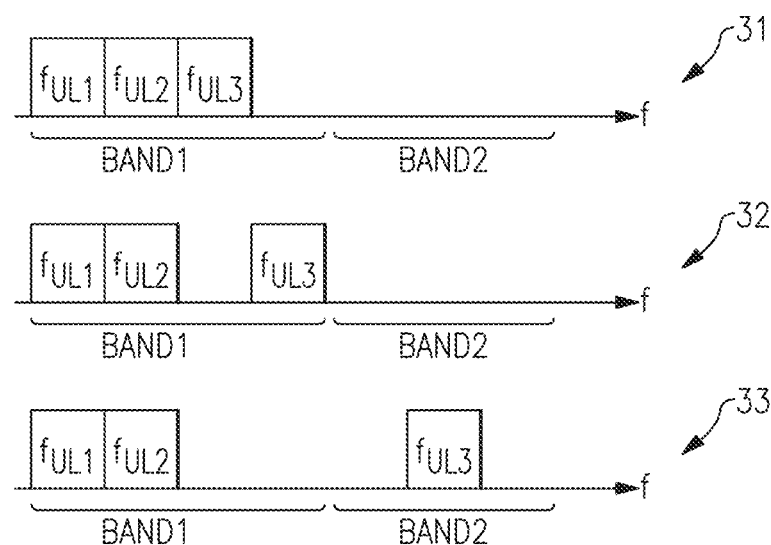
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
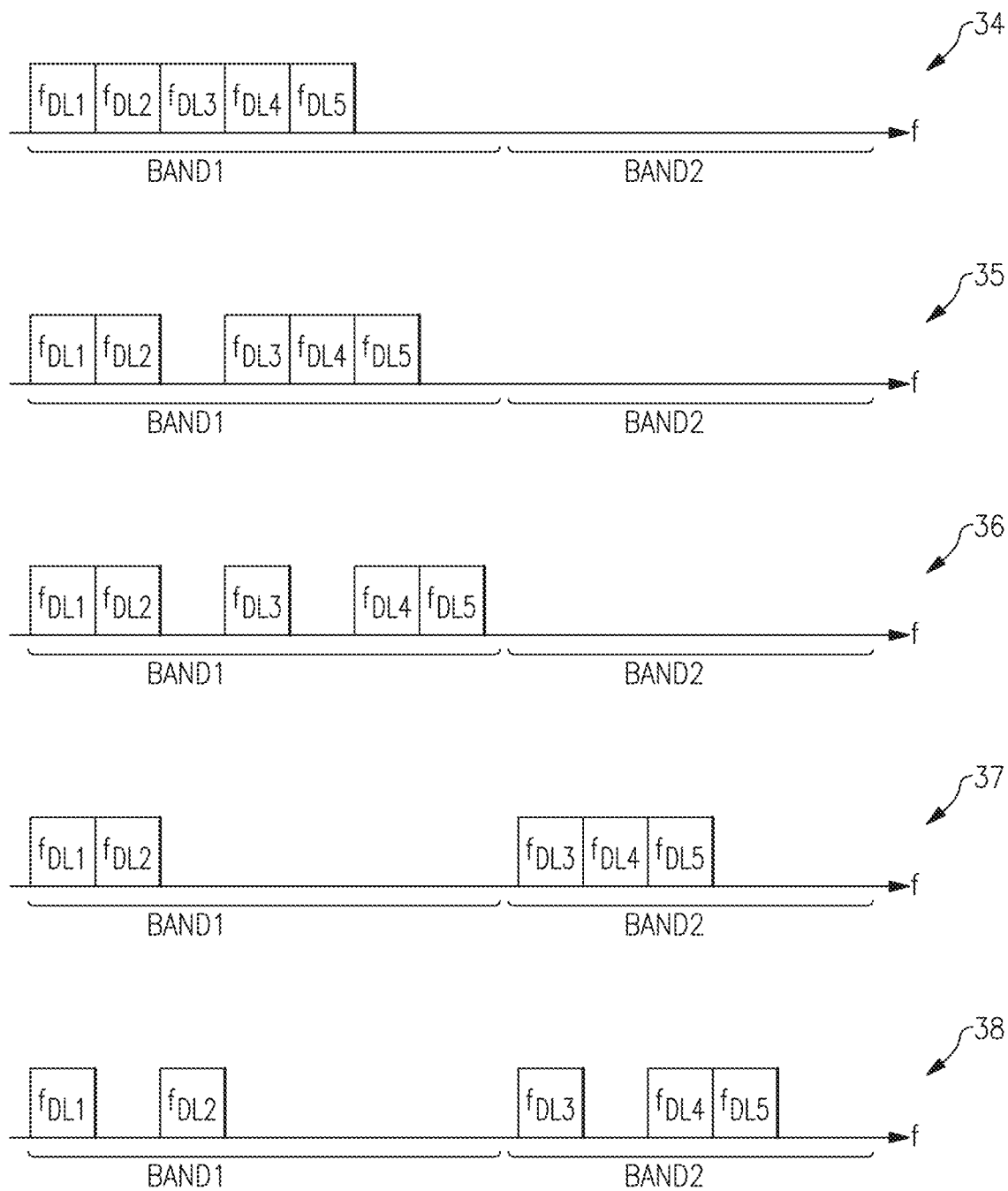
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Figure 3A:
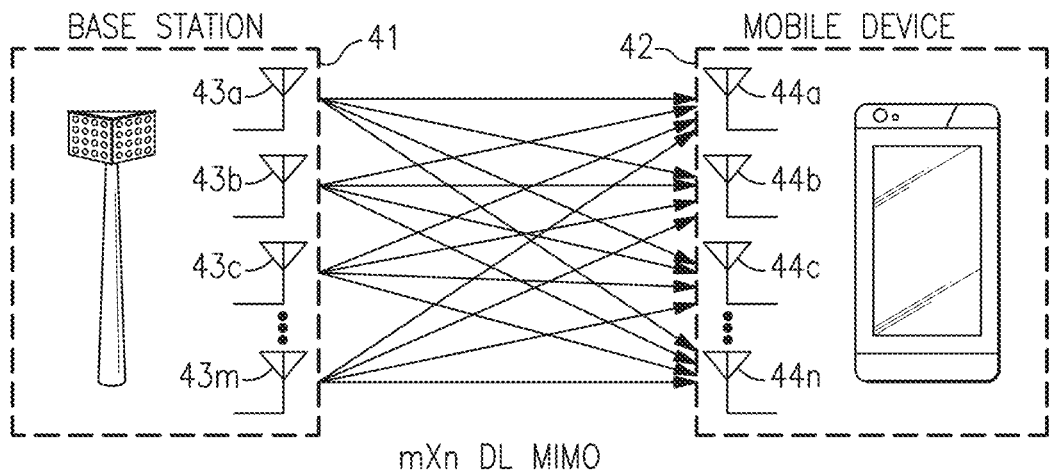
FIG. 3A is a schematic diagram of one example of a downlink channel using multi-input and multi-output (MIMO) communications.
Figure 3B:
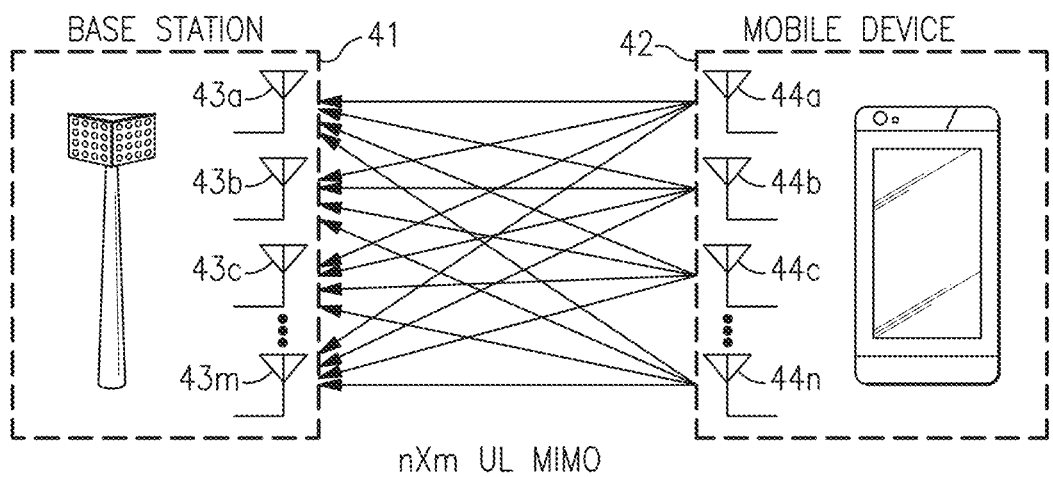
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas $43a$, $43b$, $43c$, . . . $43m$ of the base station 41 and receiving using N antennas $44a$, $44b$, $44c$, . . . $44n$ of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas $44a$, $44b$, $44c$, . . . $44n$ of the mobile device 42 and receiving using M antennas $43a$, $43b$, $43c$, . . . $43m$ of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
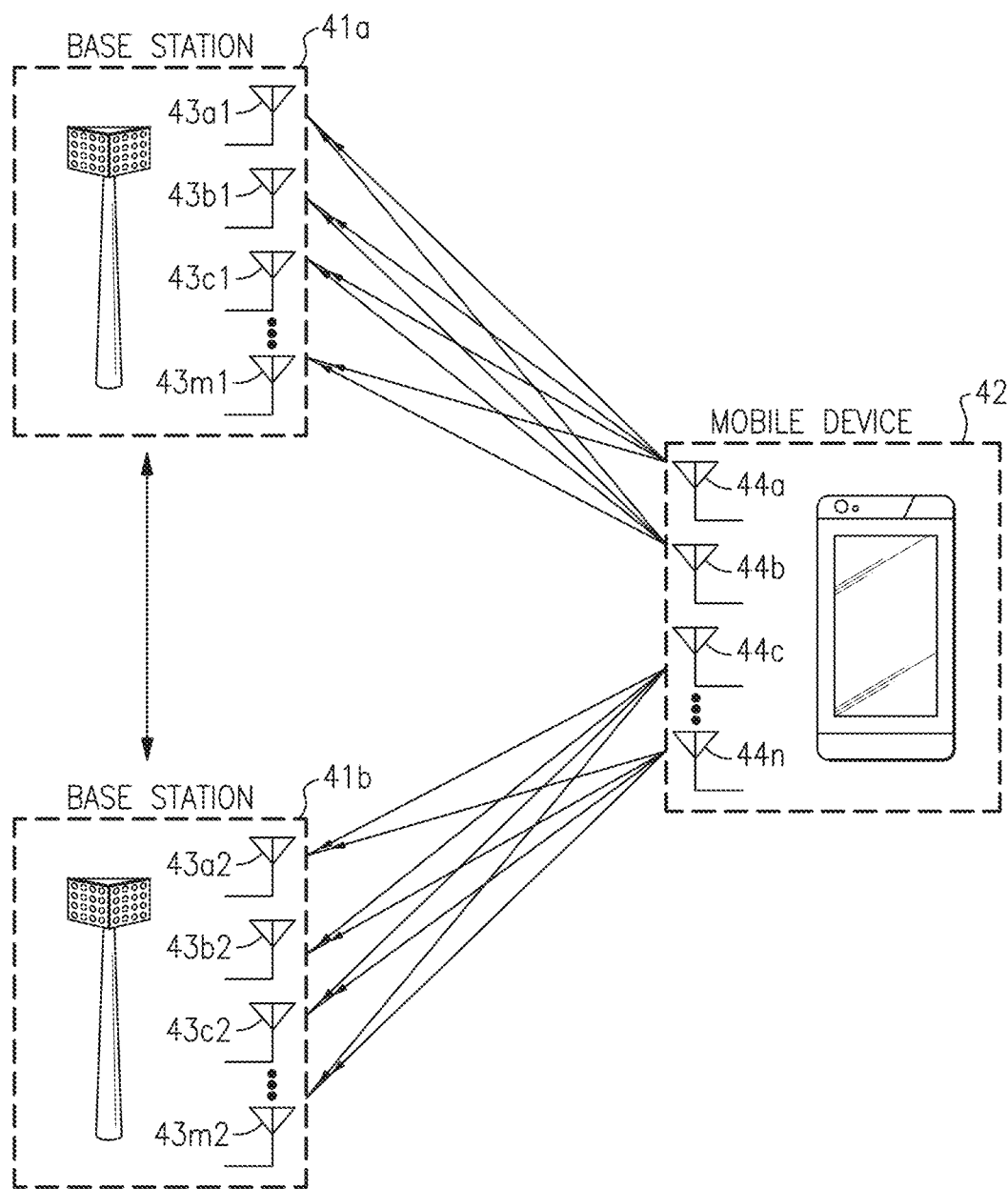
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas $44a$, $44b$, $44c$, . . . $44n$ of the mobile device 42. Additional a first portion of the uplink transmissions are received using M antennas $43a1$, $43b1$, $43c1$, . . . $43m1$ of a first base station $41a$, while a second portion of the uplink transmissions are received using M antennas $43a2$, $43b2$, $43c2$, . . . $43m2$ of a second base station $41b$. Additionally, the first base station $41a$ and the second base station $41b$ communication with one another over wired, optical, and/or wireless links.

The MIMO scenario of FIG. 3C illustrates an example in which multiple base stations cooperate to facilitate MIMO communications.

Figure 4A:
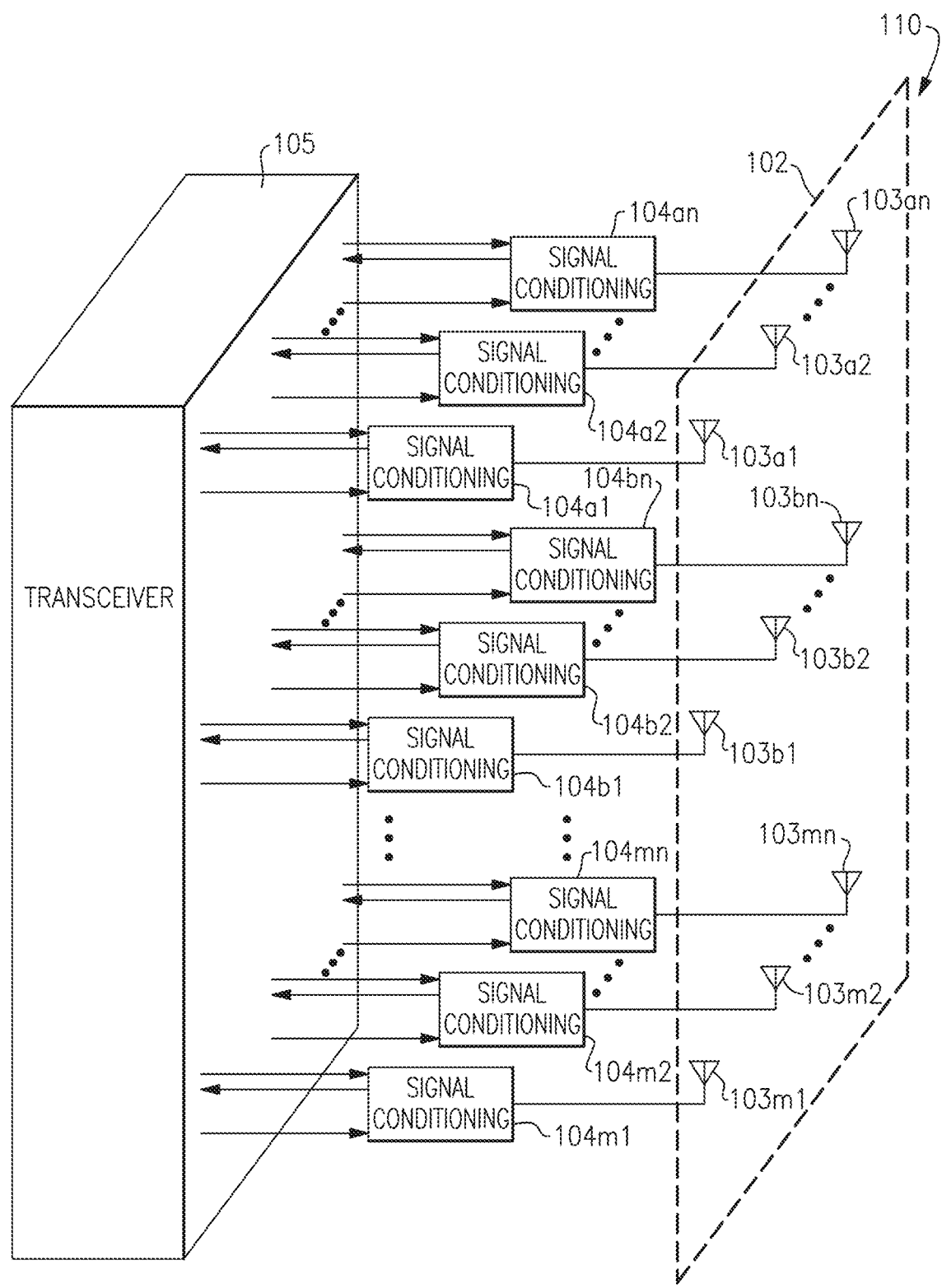
FIG. 4A is a schematic diagram of one example of a communication system that operates with beamforming.

FIG. 4A is a schematic diagram of one example of a communication system 110 that operates with beamforming. The communication system 110 includes a transceiver 105, signal conditioning circuits $104a1$, $104a2$ . . . $104an$, $104b1$, $104b2$ . . . $104bn$, $104m1$, $104m2$ . . . $104mn$, and an antenna array 102 that includes antenna elements $103a1$, $103a2$ . . . $103an$, $103b1$, $103b2$ . . . $103bn$, $103m1$, $103m2$ . . . $103mn$.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 4A, the transceiver 105 generates control signals for the signal conditioning circuits. The control signals can be used for a variety of functions, such as controlling the gain and phase of transmitted and/or received signals to control beamforming.

Figure 4B:
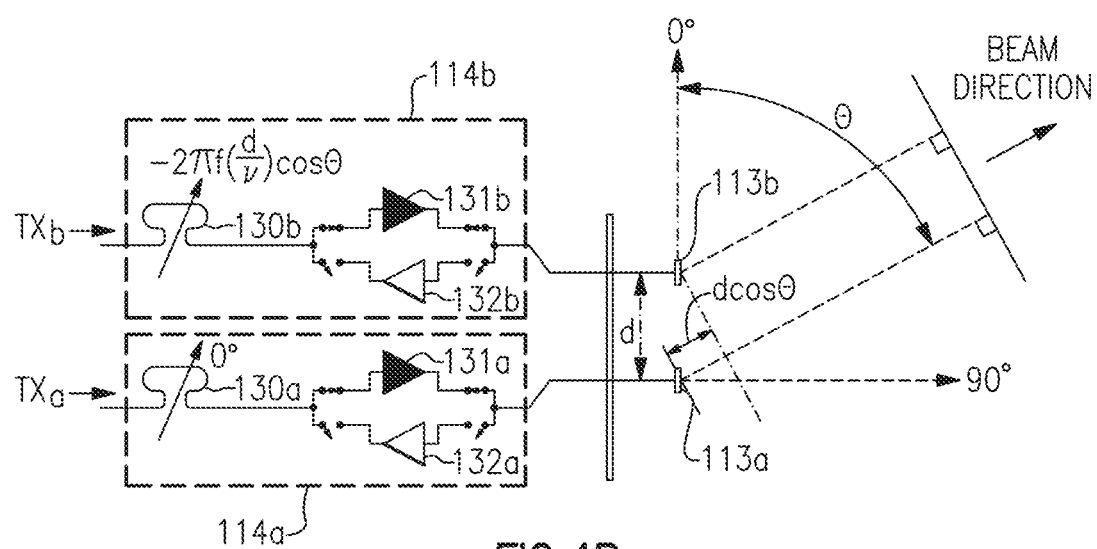
FIG. 4B is a schematic diagram of one example of beamforming to provide a transmit beam.

FIG. 4B is a schematic diagram of one example of beamforming to provide a transmit beam. FIG. 4B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 4B illustrates one embodiment of a portion of the communication system 110 of FIG. 4A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 4B has been annotated with an angle Θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle Θ can be achieved. For example, when the first phase shifter 130a has a reference value of 0°, the second phase shifter 130b can be controlled to provide a phase shift of about $-2\pi f(d/v)\cos \Theta$ radians, where f is the fundamental frequency of the transmit signal, d is the distance between the antenna elements, v is the velocity of the radiated wave, and $\pi$ is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about $-\pi \cos \Theta$ radians to achieve a transmit beam angle Θ.

Accordingly, the relative phase of the phase shifters 130a, 130b can be controlled to provide transmit beamforming. In certain implementations, a baseband processor and/or a transceiver (for example, the transceiver 105 of FIG. 4A) controls phase values of one or more phase shifters and gain values of one or more controllable amplifiers to control beamforming.

Figure 4C:
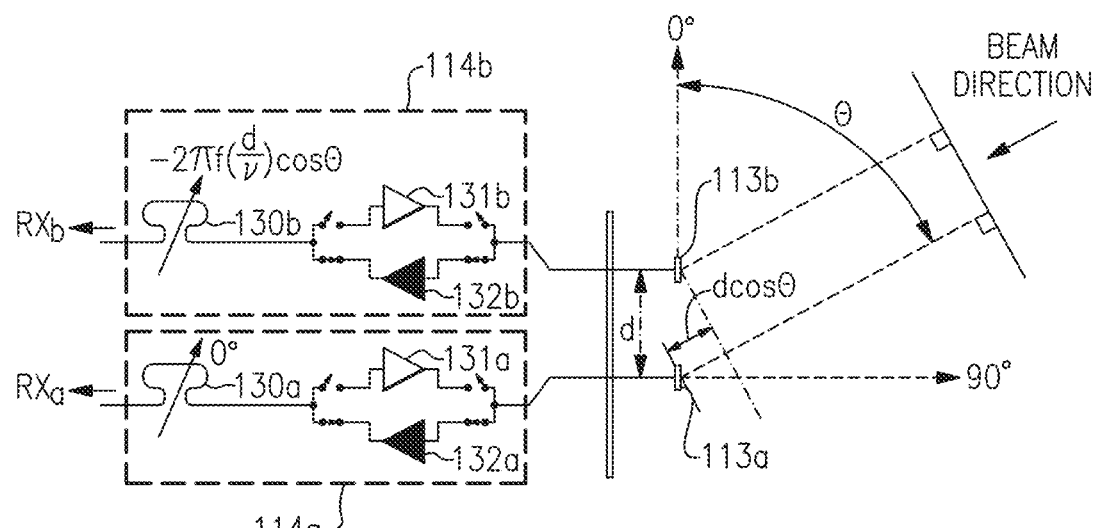
FIG. 4C is a schematic diagram of one example of beamforming to provide a receive beam.

FIG. 4C is a schematic diagram of one example of beamforming to provide a receive beam. FIG. 4C is similar to FIG. 4B, except that FIG. 4C illustrates beamforming in the context of a receive beam rather than a transmit beam.

As shown in FIG. 4C, a relative phase difference between the first phase shifter 130a and the second phase shifter 130b can be selected to about equal to $-2\pi f(d/v)\cos \Theta$ radians to achieve a desired receive beam angle Θ. In implementations in which the distance d corresponds to about ½λ, the phase difference can be selected to about equal to $-\pi \cos \Theta$ radians to achieve a receive beam angle Θ.

Although various equations for phase values to provide beamforming have been provided, other phase selection values are possible, such as phase values selected based on implementation of an antenna array, implementation of signal conditioning circuits, and/or a radio environment.

Examples of Integrated Doherty Power Amplifiers

Certain wireless communication systems, such as 5G systems, operate with relatively high data rates, relative large capacity, and/or a relatively large number of users. Furthermore, such systems can include a relatively large number of power amplifiers for driving the antenna elements of an antenna array.

To enhance the integration of such systems, it is desirable for the power amplifiers to operate with high efficiency (for instance, low DC power consumption) and/or to be implemented with a compact design.

One type of power amplifier is a Doherty power amplifier, which includes a main or carrier amplification stage and an auxiliary or peaking amplification stage that operate in combination with one another to amplify an RF input signal. The Doherty power amplifier combines a carrier signal from the carrier amplification stage and a peaking signal from the peaking stage to generate an amplified RF output signal. In certain implementations, the carrier amplification stage is enabled over a wide range of power levels while the peaking amplification stage is selectively enabled (for instance, by a class C bias circuit) at high power levels.

Doherty power amplifiers include an output phase shifter and power combiner for combining the carrier signal and the peaking signal. The output phase shifter and power combiner increase component count and/or introduce loss that degrades efficiency.

Provided herein are integrated Doherty power amplifiers that combine a carrier signal and a peaking signal using an antenna structure. For example, a multi-port antenna can be used to combine the carrier signal and the peaking signal, or separate antennas can operate in combination with one another to radiate a transmit wave in which the carrier signal and the peaking signal are combined. Accordingly, at least an output combining function of the Doherty power amplifier is implemented by the antenna structure rather than an explicit power combiner circuit. Furthermore, in certain implementations both the phase shifting and combining functions of the output section of the Doherty power amplifier are implemented by way of the antenna structure rather than by including an explicit phase shifting circuit and power combiner circuit.

For example, in certain embodiments, the Doherty power amplifier includes a carrier amplification stage that generates a carrier signal, a peaking amplification stage that generates a peaking signal, and an antenna-based phase shifter and combiner for combining the carrier signal and the peaking signal. Accordingly, in such embodiments the output section of the Doherty power amplifier is integrated into the antenna structure. Not only does integrating the output section of the Doherty power amplifier into the antenna structure avoid a need for an explicit phase shifter and power combiner, but also the Doherty power amplifier can be matched directly to the antenna's impedance. This removes additional matching components that would typically be present at a Doherty power amplifier's output.

In certain implementations, the antenna-based phase shifter and combiner includes a patch antenna including a first port that receives the carrier signal and a second port that receives the peaking signal. Additionally, the patch antenna is implemented such that the carrier signal and the peaking signal combine with appropriate phase shift. Thus, rather than a conventional patch antenna with a single signal feed, the patch antenna includes multiple signal feeds. Additionally, the input impedances of the first and second signal feeds are implemented to provide equivalent impedance of the output section of the Doherty power amplifier, such that the carrier amplification stage and the peaking amplification stage operate with appropriate output impedance.

The integrated Doherty power amplifiers herein exhibit low part count, which decreases cost and/or provides a more compact design. Furthermore, the Doherty power amplifiers can provide higher overall transmission efficiency and/or lower DC power consumption, which in turn leads to lower operating temperatures and/or improved reliability.

In certain implementations, multiple peaking amplification stages are provided. For example, two or more peaking amplification stages can be provided and biased with different turn-on power thresholds.

The teachings herein are applicable to a wide variety of RF communication systems, including, but not limited to, base stations, network access points, mobile phones, tablets, customer-premises equipment (CPE), laptops, computers, wearable electronics, and/or other communication devices.

As set forth further below, an analysis of one implementation of a Doherty power amplifier operating at 3.6 GHz and integrated with a single patch antenna is provided. Using a relative permittivity ($\varepsilon_r$) of 3.5, the patch antenna element had a simulated gain of 6.8 dBi without integration of the Doherty power amplifier. Additionally, with integration of the Doherty power amplifier, a relatively small gain reduction of about 0.3 dB (about 6.8 dBi to about 6.4 dBi) was observed. Thus, integration of a Doherty power amplifier with an antenna structure can also provide little to no impact on radiated gain.

Figure 5:
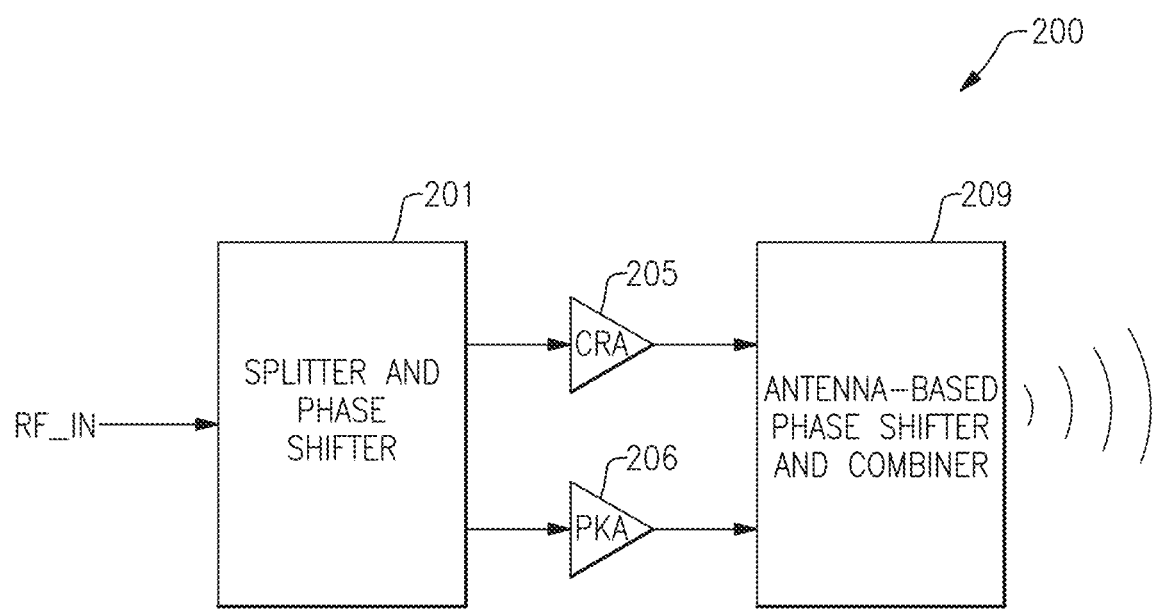
FIG. 5 is a schematic diagram of an integrated Doherty power amplifier according to one embodiment.

FIG. 5 is a schematic diagram of an integrated Doherty power amplifier 200 according to one embodiment. The integrated Doherty power amplifier 200 includes a splitter and phase shifter 201, a carrier amplification stage 205, a peaking amplification stage 206, and an antenna-based phase shifter and combiner 209.

The splitter and phase shifter 201 operates to split an RF input signal (RF_IN) to generate a first RF signal to the carrier amplification stage 205 and a second RF signal to the peaking amplification stage 206. The splitter and phase shifter 201 is also referred to herein as a splitting and phase shifting circuit. In certain implementations, the splitter and phase shifter 201 operates to output the first RF signal and the second RF signal with about equal power and a phase shift of about ninety degrees. For instance, in one example, the splitter and phase shifter 201 is implemented as a 3 dB or hybrid coupler.

The carrier amplification stage 205 amplifies the first RF signal to generate a carrier signal. Additionally, the peaking amplification stage 201 amplifies the second RF signal to generate a peaking signal. In the illustrated embodiment, the antenna-based phase shifter and combiner 209 receives the carrier signal and the peaking signal, and radiates a transmit wave.

Thus, the phase shifting and combining operations of the Doherty power amplifier are provided by the antenna-based phase shifter and combiner 209, rather than using an explicit phase shifting circuit and power combiner circuit.

By implementing the Doherty power amplifier 200 in this manner, a number of benefits can be achieved, including, but not limited to, lower part count, lower cost, enhanced integration, and/or higher transmit efficiency. For example, not only does integrating phase shifting and combining functions into the antenna-based phase shifter and combiner 209 avoid a need for an explicit phase shifter and power combiner, but also the carrier amplification stage 205 and/or the peaking amplification stage 206 can be matched directly to the impedance of the antenna-based phase shifter and combiner 209. Thus, elimination of phase shifting circuitry, power combining circuitry, and/or output matching circuitry can be achieved.

Figure 6A:
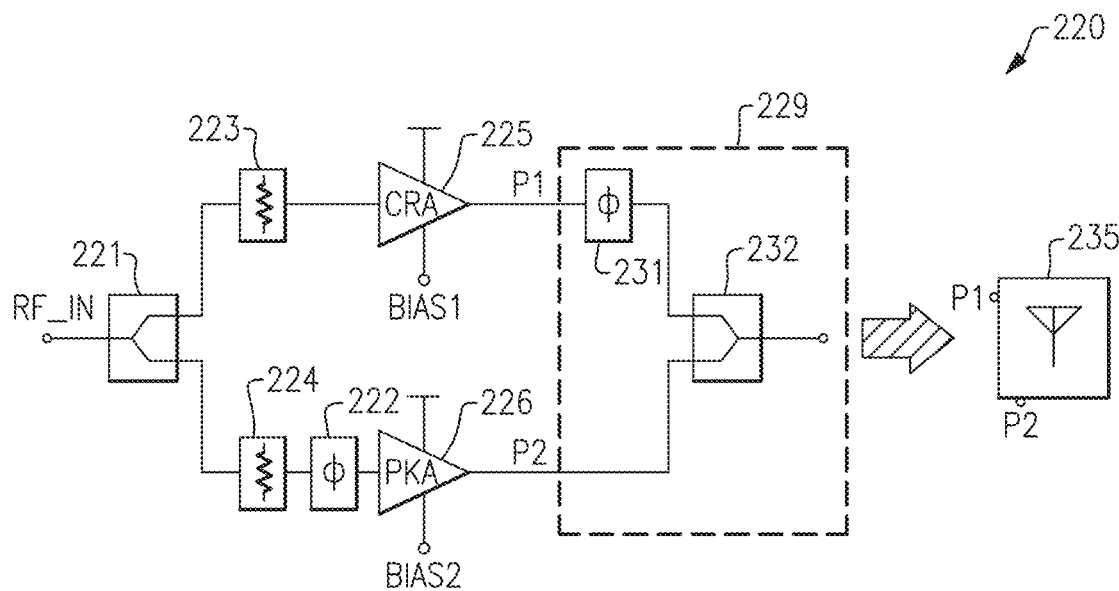
FIG. 6A is a schematic diagram of an integrated Doherty power amplifier according to another embodiment.

FIG. 6A is a schematic diagram of an integrated Doherty power amplifier 220 according to another embodiment. The integrated Doherty power amplifier 220 includes a power splitter 221, a phase shifter 222, a first attenuation component 223, a second attenuation component 224, a carrier amplification stage 225, and a peaking amplification stage 226. The integrated Doherty power amplifier 220 further includes a multi-port antenna 235 that serves as a phase shifter and combiner 229.

In the illustrated embodiment, the carrier amplification stage 225 is biased by a first bias signal (BIAS1) and the peaking amplification stage 226 is biased by a second bias signal (BIAS2). In certain implementations, the first bias signal (BIAS1) enables the carrier amplification stage 225 over a wide range of power levels while the second bias signal (BIAS2) selectively enables the peaking amplification stage 226 at high power levels. In one example, the second bias signal (BIAS2) is generated by a class C bias circuit.

As shown in FIG. 6A, the multi-port antenna 235 includes a first port P1 that receives a carrier signal from the carrier amplification stage 225, and a second port P2 that receives a peaking signal from the peaking amplification stage 226.

The multi-port antenna 235 serves not only to wirelessly transmit signals, but also to provide the functions of an output phase shifter 231 and power combiner 232. By implementing the phase shifter and combiner 229 using the multi-port antenna 235, enhanced integration and/or higher transmit efficiency is achieved.

The multi-port antenna 235 includes the first port P1 and the second port P2. The first port P1 and the second port P2 have different input impedance characteristics such that the multi-port antenna 235 provides the equivalent functionality of the phase shifter and combiner 229. For example, the input impedances of the first port P1 and the second port P2 can be implemented to achieve a phase difference of about ninety degrees between the first port P1 and the second port P2. Additionally, the phase shifted signals are combined via the antenna's ports, and wirelessly transmitted as an electromagnetic wave.

The multi-port antenna 235 can be implemented in a wide variety of ways. Examples of suitable antenna types of the multi-port antenna 235 include, but are not limited to, a patch antenna, a dipole antenna, a ceramic resonator antenna, a stamped metal antenna, or a laser direct structuring antenna.

Figure 6B:
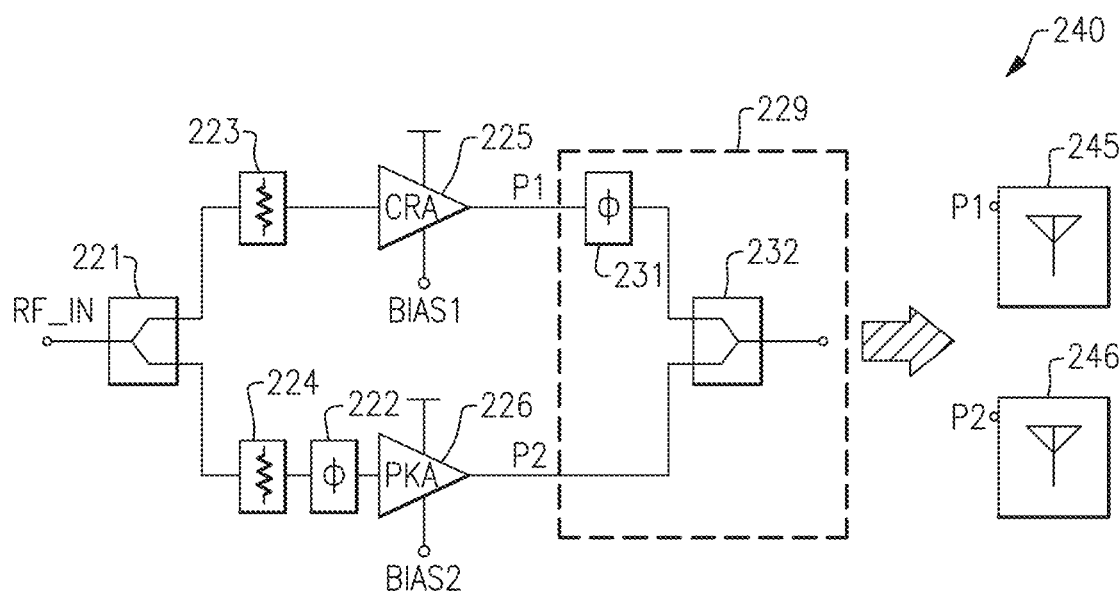
FIG. 6B is a schematic diagram of an integrated Doherty power amplifier according to another embodiment.

FIG. 6B is a schematic diagram of an integrated Doherty power amplifier 240 according to another embodiment. The integrated Doherty power amplifier 240 includes a power splitter 221, a phase shifter 222, a first attenuation component 223, a second attenuation component 224, a carrier amplification stage 225, and a peaking amplification stage 226. The integrated Doherty power amplifier 240 further includes a first antenna 245 and a second antenna 246 that serve as a phase shifter and combiner 229.

As shown in FIG. 6B, the first antenna 245 includes the first port P1, and the second antenna 246 includes the second port P2. The first port P1 and the second port P2 have different input impedance characteristics such that the first antenna 245 and the second antenna 246 provide the equivalent functionality of the phase shifter and combiner 229. For example, the input port P1 can provide a phase delay of about ninety degrees relative to the second port P2, thereby replicating the functionality of the phase shifter 231.

Additionally, a first transmit wave from the first antenna 245 and a second transmit wave from the second antenna 246 wirelessly combine via constructive interference to replicate the functionality of the power combiner 232. For example, the aggregate transmit wave radiated from the first antenna 245 and the second antenna 246 can be combined in the far field.

Examples of suitable antenna types for the first antenna 245 and the second antenna 246 include, but are not limited to, patch antennas, dipole antennas, ceramic resonator antennas, stamped metal antennas, or laser direct structuring antennas.

Figure 6C:
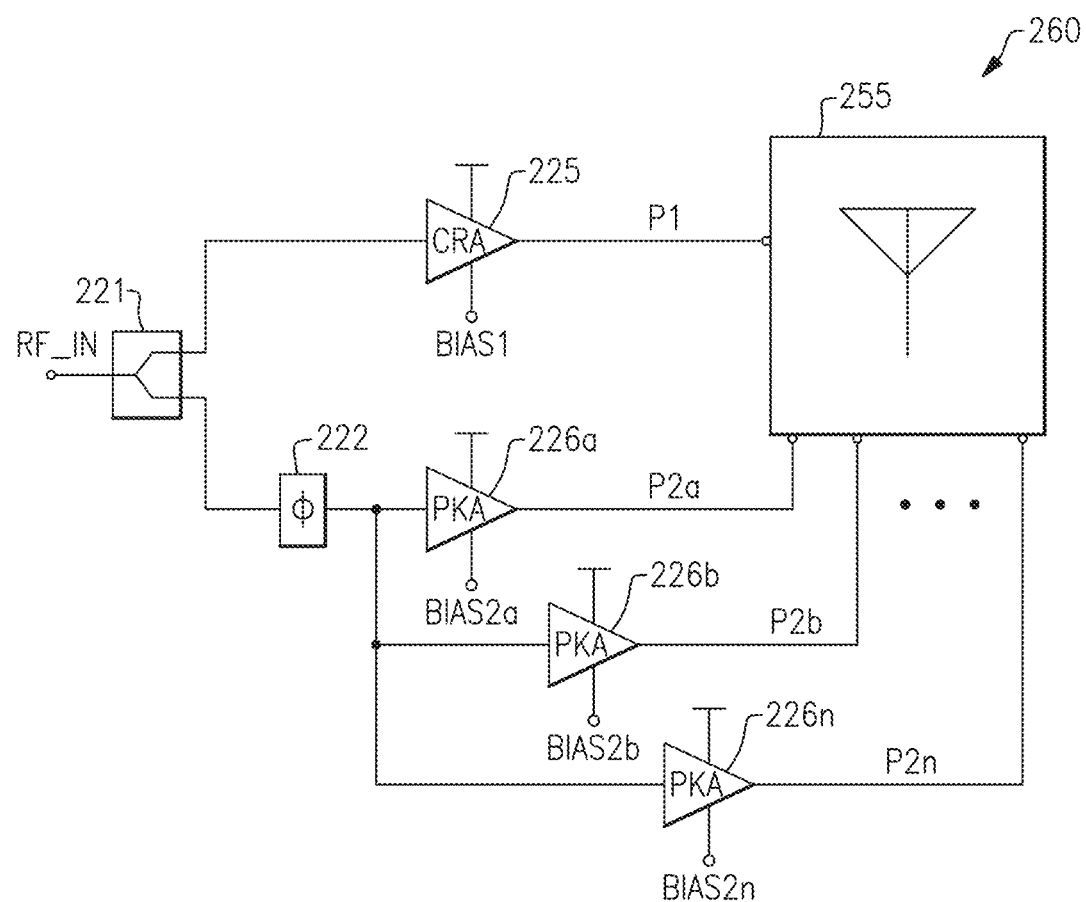
FIG. 6C is a schematic diagram of an integrated Doherty power amplifier according to another embodiment.

FIG. 6C is a schematic diagram of an integrated Doherty power amplifier 260 according to another embodiment. The integrated Doherty power amplifier 260 includes a power splitter 221, a phase shifter 222, a carrier amplification stage 225, and peaking amplification stages 226a, 226b, . . . 226n. The integrated Doherty power amplifier 220 further includes a multi-port antenna 255 that serves as a phase shifter and combiner.

In the illustrated embodiment, the carrier amplification stage 225 is biased by a first bias signal (BIAS1), while the peaking amplification stages 226a, 226b, . . . 226n are biased by second bias signals BIAS2a, BIAS2b, . . . BIAS2n. In certain implementations, the first bias signal (BIAS1) enables the carrier amplification stage 225 over a wide range of power levels while the second bias signals BIAS2a, BIAS2b, . . . BIAS2n selectively enable the peaking amplification stages 226a, 226b, . . . 226n, respectively, at various high power levels or thresholds, which can vary from one another.

As shown in FIG. 6C, the multi-port antenna 255 includes a first port P1 that receives a carrier signal from the carrier amplification stage 225 and second ports P2a, P2b, . . . P2n that receive peaking signals from the peaking amplification stages 226a, 226b, . . . 226n, respectively.

Although an embodiment with three peaking amplification stages is depicted, the teachings herein are applicable to Doherty power amplifiers with more or fewer peaking amplification stages.

The multi-port antenna 255 serves not only to wirelessly transmit signals, but also to provide the functions of an output phase shifter and power combiner.

Figure 6D:
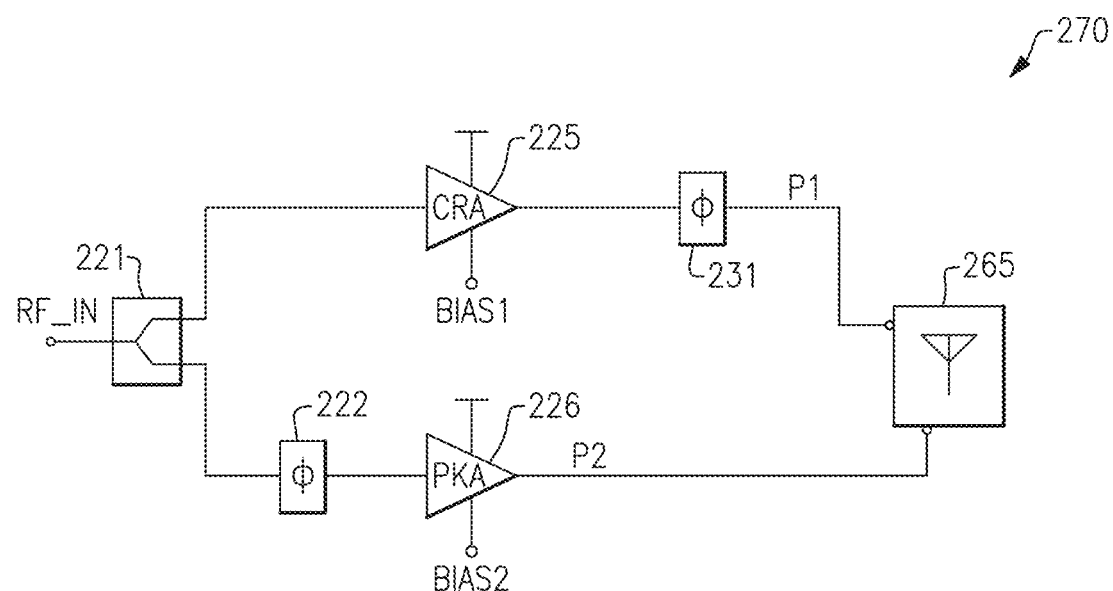
FIG. 6D is a schematic diagram of an integrated Doherty power amplifier according to another embodiment.

FIG. 6D is a schematic diagram of an integrated Doherty power amplifier 270 according to another embodiment. The integrated Doherty power amplifier 270 includes a power splitter 221, an input phase shifter 222, a carrier amplification stage 225, a peaking amplification stage 226, and an output phase shifter 231. The integrated Doherty power amplifier 270 further includes a multi-port antenna 265 that serves as a combiner.

The output phase shifter 231 provides at least a portion of the output phase shifting of the carrier signal from the carrier amplification stage 225. In certain implementations, the multi-port antenna 265 provides little to no phase shifting, and the output phase shifter 231 provides a phase shift of about ninety degrees. In other implementations, the multi-port antenna 265 provides a first amount of phase shifting (for instance, a coarse phase shift), while the output phase shifter 231 provides a second amount of phase shift (for instance, a fine phase shift. The output phase shifter 231 can be implemented in a wide variety of ways, including, but not limited to, using a varactor and/or other controllable capacitance components.

Figure 6E:
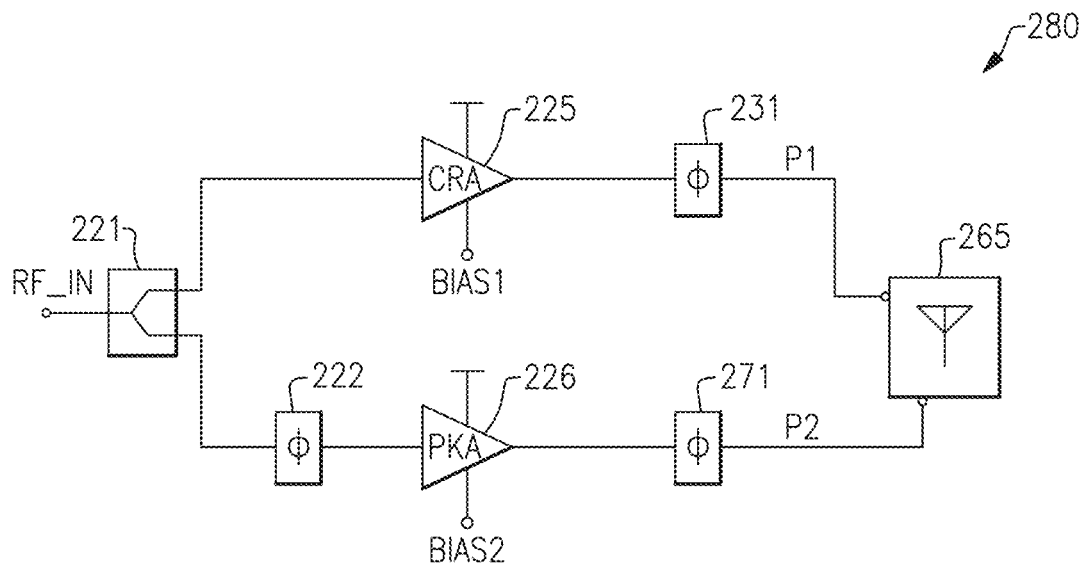
FIG. 6E is a schematic diagram of an integrated Doherty power amplifier according to another embodiment.

FIG. 6E is a schematic diagram of an integrated Doherty power amplifier 280 according to another embodiment. The integrated Doherty power amplifier 280 includes a power splitter 221, an input phase shifter 222, a carrier amplification stage 225, a peaking amplification stage 226, a first output phase shifter 231, and a second output phase shifter 271. The integrated Doherty power amplifier 280 further includes a multi-port antenna 265 that serves as a combiner.

The integrated Doherty power amplifier 280 of FIG. 6E is similar to the integrated Doherty power amplifier 270 of FIG. 6D, except that the integrated Doherty power amplifier 280 includes multiple output phase shifters. In particular, the integrated Doherty power amplifier 280 includes the first output phase shifter 231 between the output of the carrier amplification stage 225 and the first port of the multi-port antenna 265, and the second output phase shifter 271 between the output of the peaking amplification stage 226 and the second port of the multi-port antenna 265.

The first output phase shifter 231 and the second output phase shifter 271 operate to control the phase difference between the carrier signal received at the first port of the multi-port antenna 265 and the peaking signal received at the second port of the multi-port antenna 265. In certain implementations, the multi-port antenna 265 provides a first amount of phase shifting (for instance, a coarse phase shift), while the first output phase shifter 231 and the second output phase shifter 271 provide a second amount of phase shift (for instance, a fine phase shift).

Figure 6F:
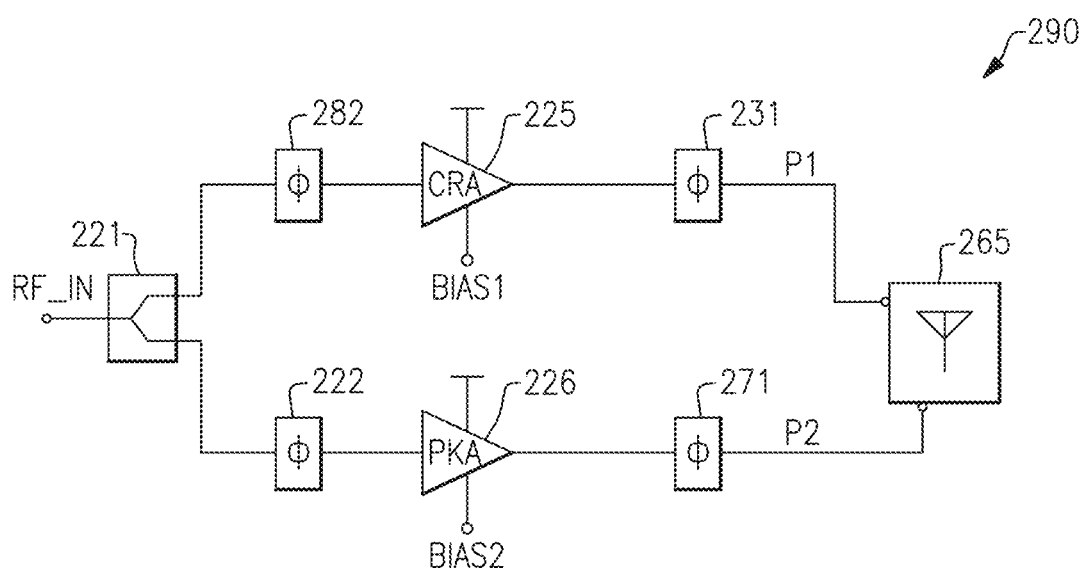
FIG. 6F is a schematic diagram of an integrated Doherty power amplifier according to another embodiment.

FIG. 6F is a schematic diagram of an integrated Doherty power amplifier 290 according to another embodiment. The integrated Doherty power amplifier 290 includes a power splitter 221, a first input phase shifter 222, a second input phase shifter 282, a carrier amplification stage 225, a peaking amplification stage 226, a first output phase shifter 231, and a second output phase shifter 271. The integrated Doherty power amplifier 290 further includes a multi-port antenna 265 that serves as a combiner.

The integrated Doherty power amplifier 290 of FIG. 6F is similar to the integrated Doherty power amplifier 280 of FIG. 6E, except that the integrated Doherty power amplifier 290 includes multiple input phase shifters. In particular, the integrated Doherty power amplifier 290 includes the first input phase shifter 222 between the power splitter 221 and the input of the peaking amplification stage 226, and the second input phase shifter 282 between the power splitter 221 and the input of the carrier amplification stage 225. Including multiple input phase shifters provides an additional degree of design flexibility.

Figure 7A:
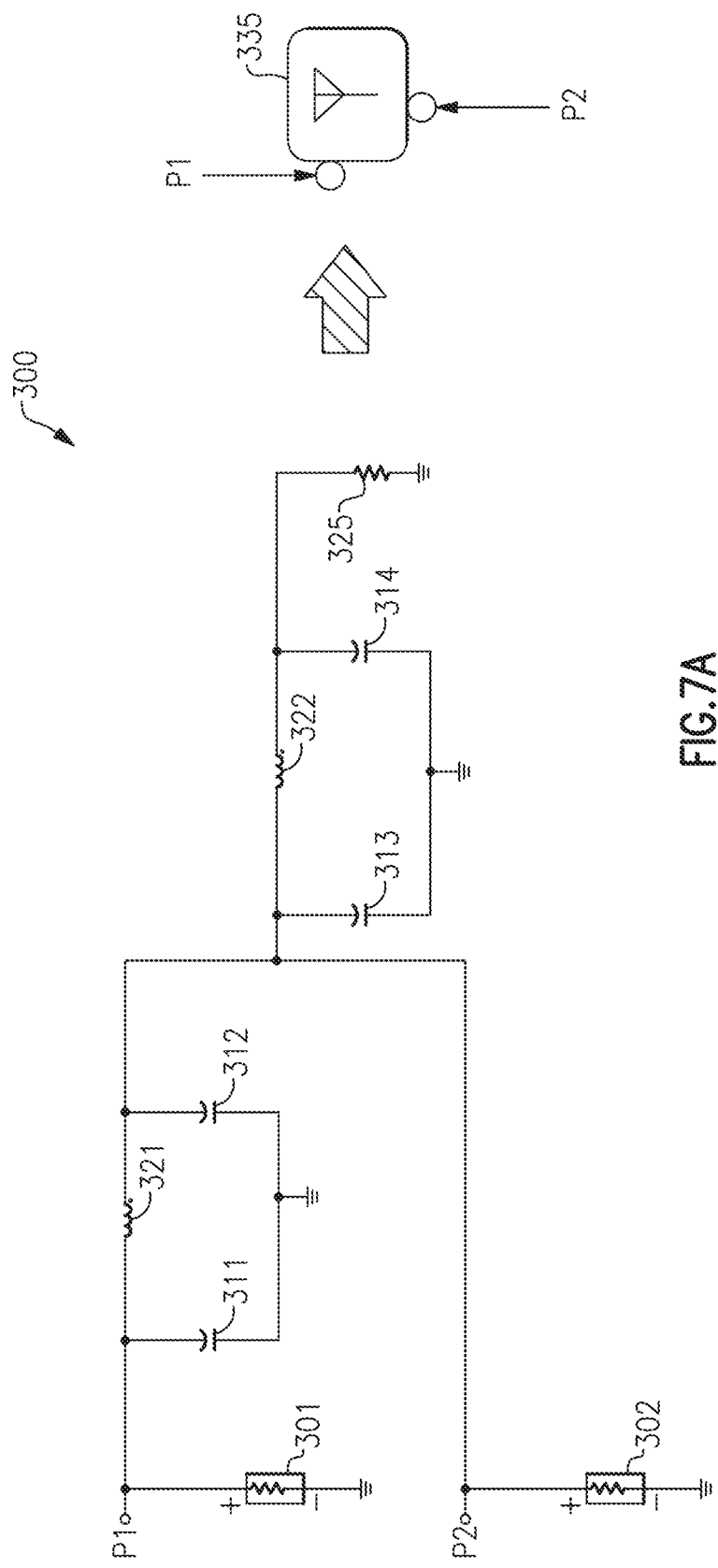
FIG. 7A is an impedance model of a multi-feed patch antenna according to one embodiment.

FIG. 7A is an impedance model 300 of a multi-feed patch antenna 335 according to one embodiment. As shown in FIG. 7A, the multi-feed patch antenna 335 includes a first port P1 and a second port P2. The impedance model 300 includes a first input termination resistor 301, a second input termination resistor 302, a first shunt capacitor 311, a second shunt capacitor 312, a third shunt capacitor 313, a fourth shunt capacitor 314, a first series inductor 321, a second series inductor 322, and an output termination resistor 325.

In certain implementations herein, an antenna-based phase shifter and combiner is implemented with impedance modifications and/or transformations such that a peaking amplification stage and carrier amplification stage match into the antenna load. For example, a phase shifter/combiner with a load impedance can be replaced with an antenna load. For instance, in one example, a 50 Ohm load is replaced by a 377 Ohm load representing air.

Figure 7C:
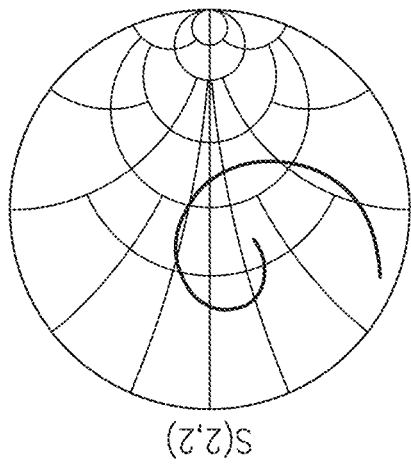
FIG. 7C is one example of a Smith chart of S22 for the multi-feed patch antenna of FIG. 7A.
Figure 7E:
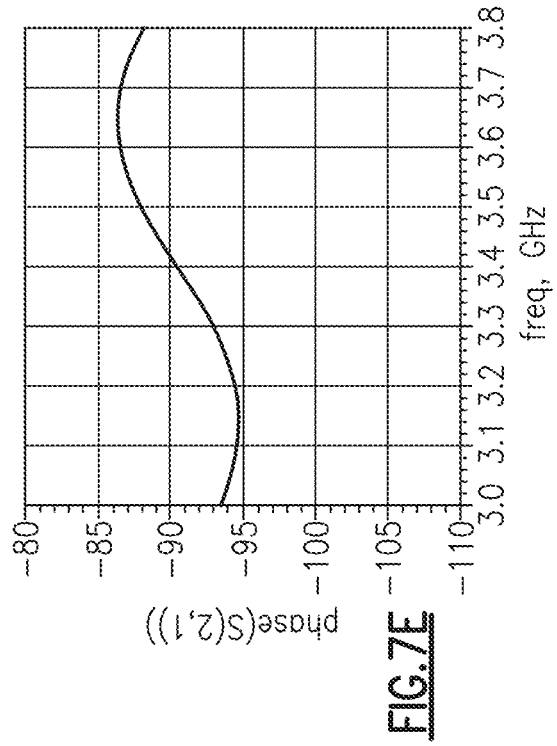
FIG. 7E is a graph of one example of phase shift versus frequency for the multi-feed patch antenna of FIG. 7A.
Figure 7B:
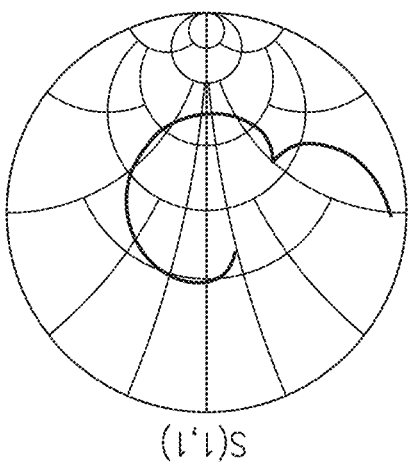
FIG. 7B is one example of a Smith chart of S11 for the multi-feed patch antenna of FIG. 7A.
Figure 7D:
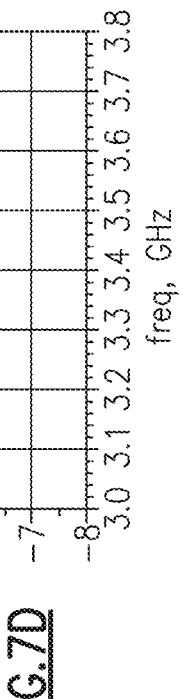
FIG. 7D is a graph of one example of isolation versus frequency for the multi-feed patch antenna of FIG. 7A.

FIGS. 7B-7D are simulation results of various performance parameters of the multi-feed patch antenna 335 of FIG. 7A generated based on the impedance model 300 of FIG. 7A.

The simulation results correspond to a configuration of the impedance model 300 in which a resistance of the first input termination resistor 301 is about 50 Ohm, a resistance of the second input termination resistor 302 is about 50 Ohm, a capacitance of the first shunt capacitor 311 is about 4 pF, a capacitance of the second shunt capacitor 312 is about 4 pF, a capacitance of the third shunt capacitor 313 is about 35 pF, a capacitance of the fourth shunt capacitor 314 is about 35 pF, an inductance of the first series inductor 321 is about 4 nH, an inductance of the second series inductor 322 is about 35 nH, and a resistance of the output termination resistor 325 is about 377 Ohm.

FIG. 7B is one example of a Smith chart of S11 for the multi-feed patch antenna 335 of FIG. 7A. The Smith chart provides a graphical illustration of reflection coefficient at port P1 of the multi-feed patch antenna 335. The Smith chart was generated for a frequency sweep between 1 gigahertz (GHz) and 6 GHz.

FIG. 7C is one example of a Smith chart of S22 for the multi-feed patch antenna 335 of FIG. 7A. The Smith chart provides a graphical illustration of reflection coefficient at port P2 of the multi-feed patch antenna 335. The Smith chart was generated for a frequency sweep between 1 GHz and 6 GHz.

FIG. 7D is a graph of one example of isolation versus frequency for the multi-feed patch antenna of FIG. 7A. The graph depicts forward transmission in decibels (dB) versus frequency. As shown in FIG. 7D, an isolation between about 4 dB to 6 dB is achieved across a frequency range of 3 GHz to 3.8 GHz.

FIG. 7E is a graph of one example of phase shift versus frequency for the multi-feed patch antenna of FIG. 7A. The graph depicts phase shift between port P1 and port P2. As shown in FIG. 7E, a phase shift of 90°±5° is provided across a frequency range of 3 GHz to 3.8 GHz.

Figure 8A:
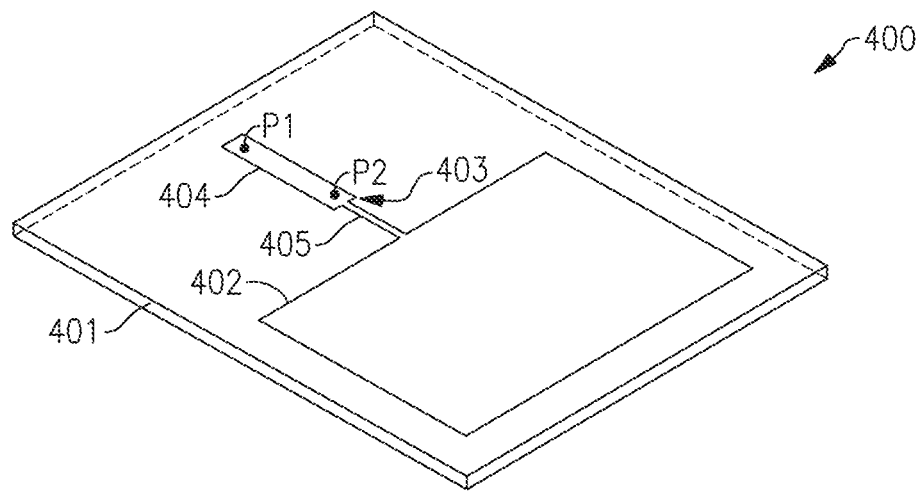
FIG. 8A is a perspective view of a patch antenna with impedance transformer according to one embodiment.

FIG. 8A is a perspective view of a patch antenna with impedance transformer 400 according to one embodiment. The patch antenna with impedance transformer 400 includes a substrate 401 including a patch antenna element 402 and an impedance transformer 403 formed thereon.

The impedance transformer 403 includes a wide metal region 404 including a first port P1 and a second port P2 for receiving a carrier signal and a peaking signal, respectively. The carrier signal and the peaking signal can be provided in a wide variety of ways, such as using vias or electromagnetic coupling from structures positioned beneath each port. The impedance transformer 403 further includes a narrow metal region 405 of narrower width than the wide metal region 404.

As shown in FIG. 8A, the carrier signal and the peaking signal are provided to the wide metal region 404, and propagate through the narrow metal region 405 to reach the patch antenna element 402.

The difference in width between the wide metal region 404 and the narrow metal region 405, the difference in width between the narrow metal region 405 and the patch antenna element 402, and/or a relative distance from each port to the patch antenna element 402 provides an impedance transformation.

The impedance transformation can provide a number of functions, including providing output matching to the carrier amplification stage and the peaking amplification stage that drive the first port P1 and the second port P2, respectively. For example, the impedance transformer 403 can provide impedance modifications to provide matching into the patch antenna element 402.

Additionally, a difference in spacing between the first port P1 and the second port P2 provides a phase delay between the ports to achieve a desired amount of phase shift. For example, a phase shift of about ninety degrees can be achieved over a desired range of frequencies by selecting a suitable spacing between the first port P1 and the second port P2.

In certain implementations, the substrate 401 includes two or more metal layers, and the patch antenna element 402 and the impedance transformer 403 are formed of metal on a first metal layer of the substrate 401. Additionally, at least one other metal layer of the substrate 401 includes a ground plane that extends at least in part beneath the patch antenna element 402 and/or the impedance transformer 403.

Figure 8B:
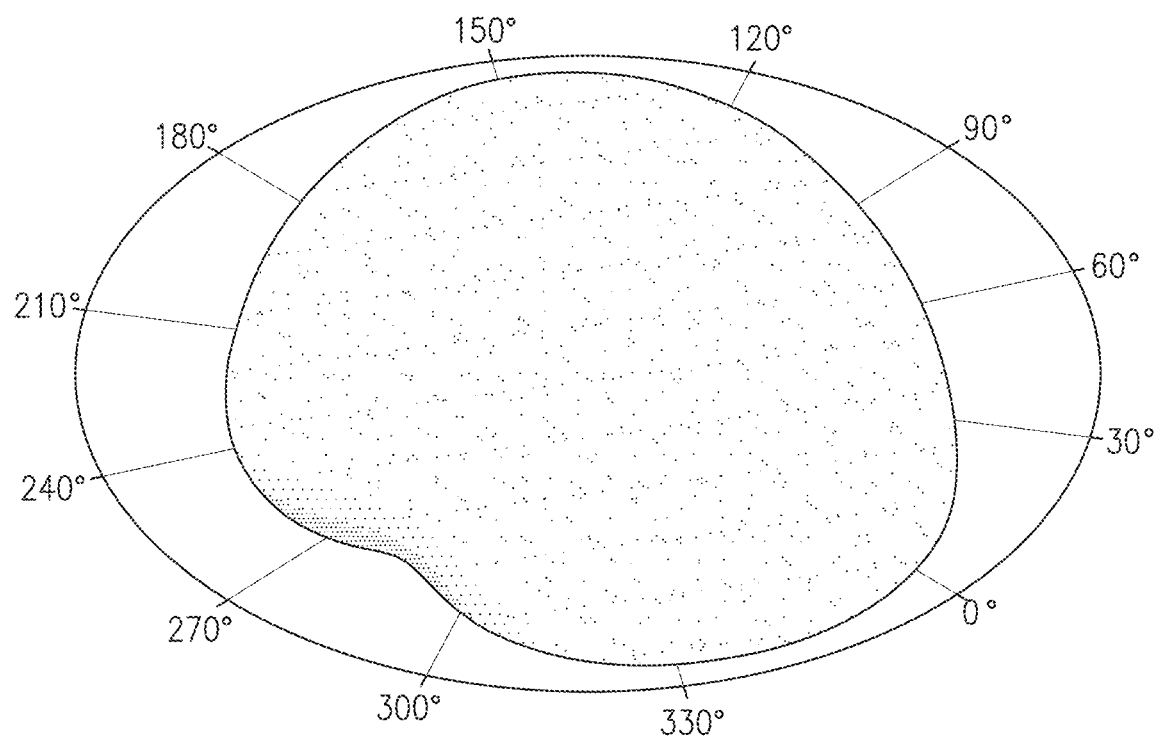
FIG. 8B is a schematic diagram of a radiation pattern for the patch antenna with impedance transformer of FIG. 8A.

FIG. 8B is a schematic diagram of a radiation pattern for the patch antenna with impedance transformer 400 of FIG. 8A. The radiation pattern is simulated at a frequency of 3.6 GHz for an implementation in which the patch antenna 402 has a width of about 30.7 millimeters (mm) and a length of about 21.98 mm. As shown in FIG. 8B, the patch antenna with impedance transformer 400 exhibits a relatively uniform radiation pattern, which is desirable in certain applications.

Figure 9A:
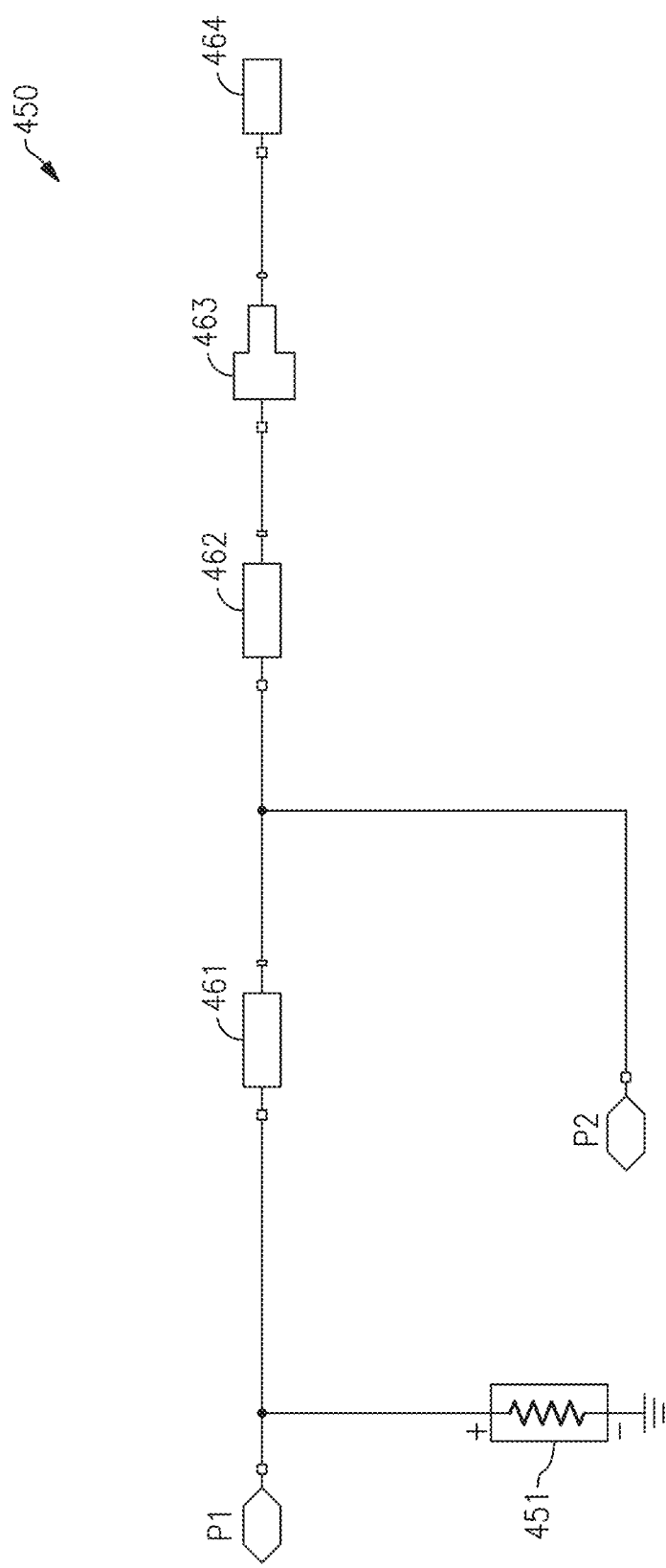
FIG. 9A is an impedance model of the patch antenna with impedance transformer of FIG. 8A according to one embodiment.

FIG. 9A is an impedance model 450 of the patch antenna with impedance transformer 400 of FIG. 8A according to one embodiment. The impedance model 450 includes a first port P1, a second port P2, an input termination resistor 451, a first metal section 461, a second metal section 462, a metal step 463, and a patch antenna section 464.

FIGS. 9B-9E are simulation results of various performance parameters of the patch antenna with impedance transformer 400 of FIG. 8A generated based on the impedance model 450 of FIG. 9A.

The simulation results correspond to a configuration of the impedance model 450 in which the input termination resistor 451 has a resistance of about 50 Ohm, in which the metal section 461 has a width of about 2.3 mm and a length of about 12.2 mm, in which the metal section 462 has a width of about 0.6 mm and a length of about 6 mm, in which the metal step 463 transitions from about 0.6 mm to about 30.7 mm, and in which the patch antenna section 464 has a width of about 30.7 mm and a length of about 21.98 mm.

Figure 9C:
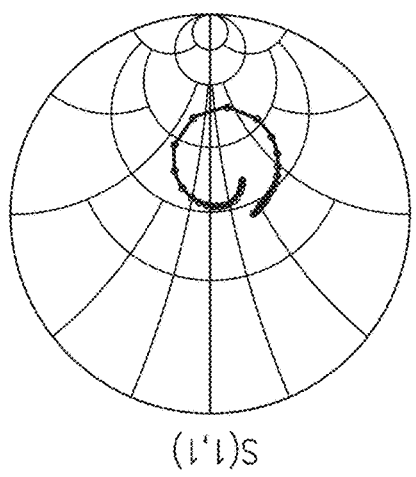
FIG. 9C is one example of a Smith chart of S22 for the patch antenna with impedance transformer of FIG. 9A.
Figure 9B:
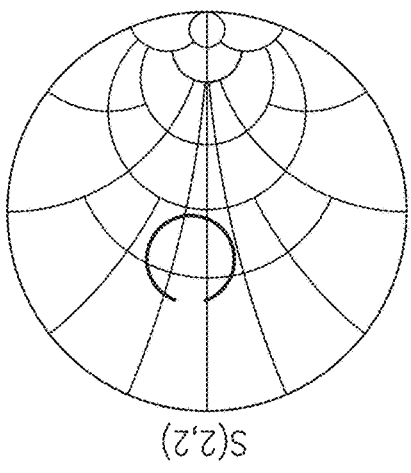
FIG. 9B is one example of a Smith chart of S11 for the patch antenna with impedance transformer of FIG. 8A.

FIG. 9B is one example of a Smith chart of S11 for the patch antenna with impedance transformer 400 of FIG. 8A. The Smith chart provides a graphical illustration of reflection coefficient at port P1 of the patch antenna with impedance transformer 400. The Smith chart was generated for a frequency sweep between 3 GHz and 4 GHz.

FIG. 9C is one example of a Smith chart of S22 for the patch antenna with impedance transformer 400 of FIG. 9A. The Smith chart provides a graphical illustration of reflection coefficient at port P2 of the patch antenna with impedance transformer 400. The Smith chart was generated for a frequency sweep between 3 GHz and 4 GHz.

Figure 9E:
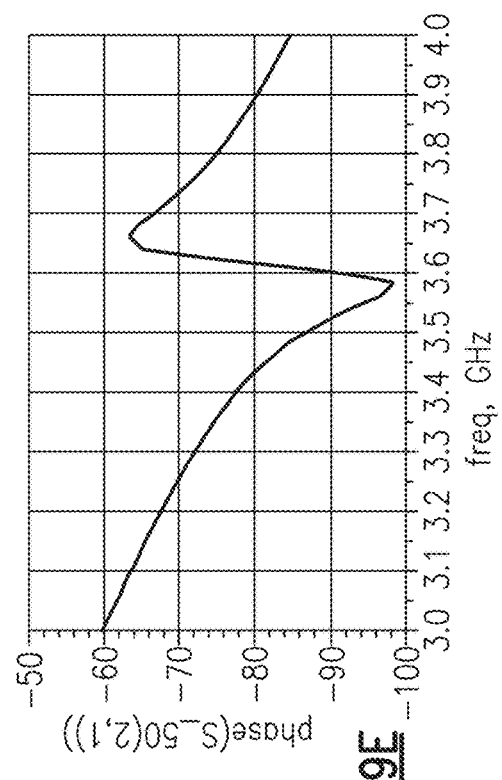
FIG. 9E is a graph of one example of phase shift versus frequency for the patch antenna with impedance transformer of FIG. 8A.
Figure 9D:
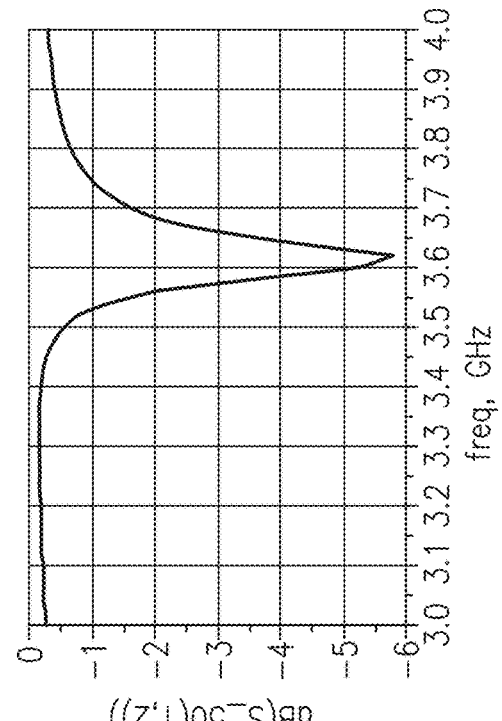
FIG. 9D is a graph of one example of isolation versus frequency for the patch antenna with impedance transformer of FIG. 8A.

FIG. 9D is a graph of one example of isolation versus frequency for the patch antenna with impedance transformer 400 of FIG. 8A. The graph depicts forward transmission in dB versus frequency.

FIG. 9E is a graph of one example of phase shift versus frequency for the patch antenna with impedance transformer 400 of FIG. 8A. The graph depicts phase shift between port P1 and port P2.

Figure 10A:
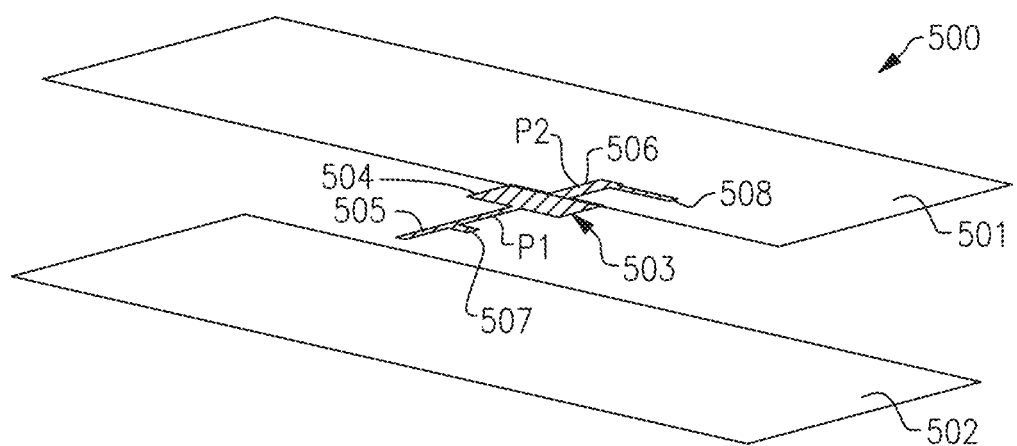
FIG. 10A is a perspective view of a multi-feed patch antenna according to one embodiment.
Figure 10B:
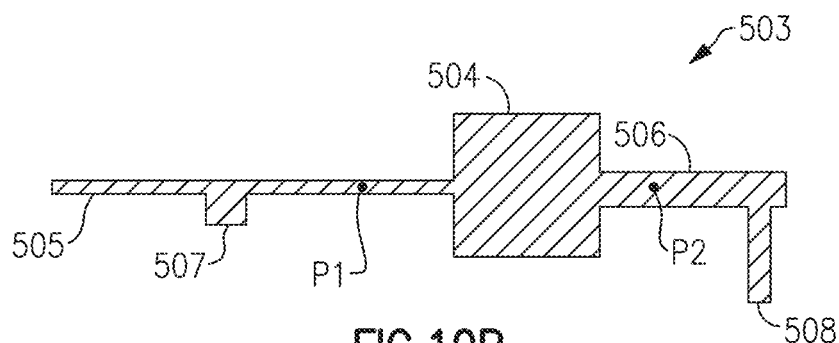
FIG. 10B is a plan view of the impedance transformer of FIG. 10A.

FIG. 10A is a perspective view of a multi-feed patch antenna 500 according to one embodiment. The multi-feed patch antenna 500 includes a patch antenna element 501, a ground plane 502, and an impedance transformer 503. FIG. 10B is a plan view of the impedance transformer 503 of FIG. 10A.

Although not depicted in FIG. 10A, in certain implementations the multi-feed patch antenna 500 is implemented on a multi-layer substrate, such as a laminate. For example, the multi-feed patch antenna 500 can be implemented in a substrate of a module, such as a packaged module including one or more semiconductor dies therein.

With reference to FIGS. 10A and 10B, the impedance transformer 503 includes a feed conductor section 504 for electromagnetically coupling to the patch antenna element 501. The feed conductor section 504 is coupled to the patch antenna element 501 by fields without a direct electrical connection, in this embodiment. The impedance transformer 503 further includes a first input conductor 505 including a first stub 507 and a first port P1. The impedance transformer 503 further includes a second input conductor 506 including a second stub 508 and a second port P2.

The multi-feed patch antenna 500 includes impedance transformers integrated under the patch antenna element 500 to provide a compact design. Additionally, the impedance transformer 503 is implemented to provide separate impedance transformations for the first port P1 and the second port P2, thereby enhancing design flexibility.

In the illustrated embodiment, the impedance transformation provided to the first port P1 is controlled by dimensions of the first input conductor 505 and the first stub 507, while the impedance transformation provided to the second port P2 is controlled by dimensions of the second input conductor 506 and the second stub 508.

By selecting different dimensions, a desired amount of impedance transformation can be achieved for the first port P1 and the second port P2. Moreover, the impedance transformations need not be the same. For instance, in one example, a quarter wave impedance transformation between about 25 Ohm to 377 Ohm is provided for the first port P1, while an impedance transformation between about 25 Ohm to 100 Ohm is provided for the second port.

Providing different impedance transformations can aid in providing desired impedances for different sections or stages of a Doherty power amplifier. For instance, for the example above, the impedance transformations provide enhanced performance for an implementation in which the peaking amplification stage operates with an impedance of about 25 Ohm, and in which the carrier amplification stage operates with an impedance of about 100 Ohm. Although an example of specific impedance values has been provided, desired impedances for a peaking amplification stage and/or a carrier amplification stage can depend on a wide variety of factors, including, but not limited to application and/or implementation.

Figure 10C:
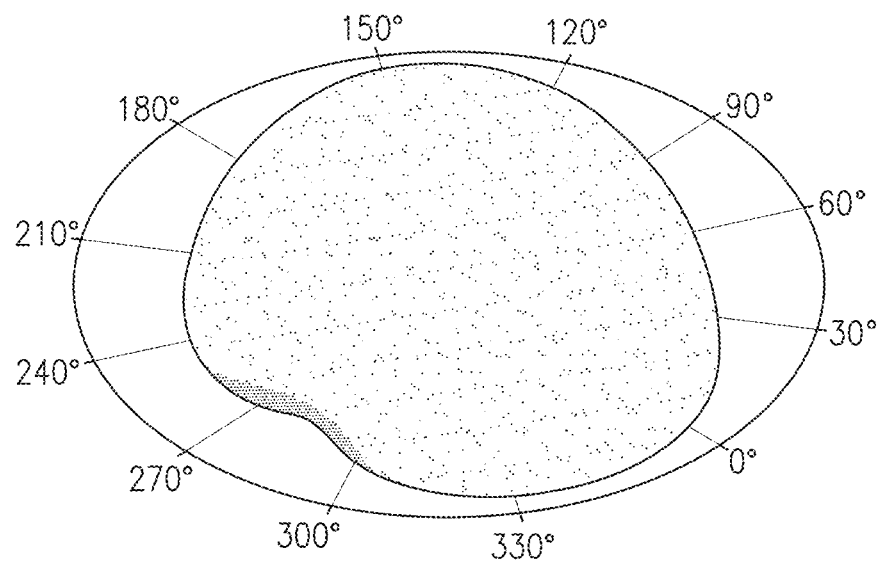
FIG. 10C is a schematic diagram of a radiation pattern for the multi-feed patch antenna of FIG. 10A.

FIG. 10C is a schematic diagram of a radiation pattern for the multi-feed patch antenna 500 of FIG. 10A. The radiation pattern is simulated at a frequency of 3.6 GHz for one implementation of the multi-feed patch antenna 500. As shown in FIG. 10C, the multi-feed patch antenna 500 exhibits a relatively uniform radiation pattern, which is desirable in certain applications.

Figure 11A:
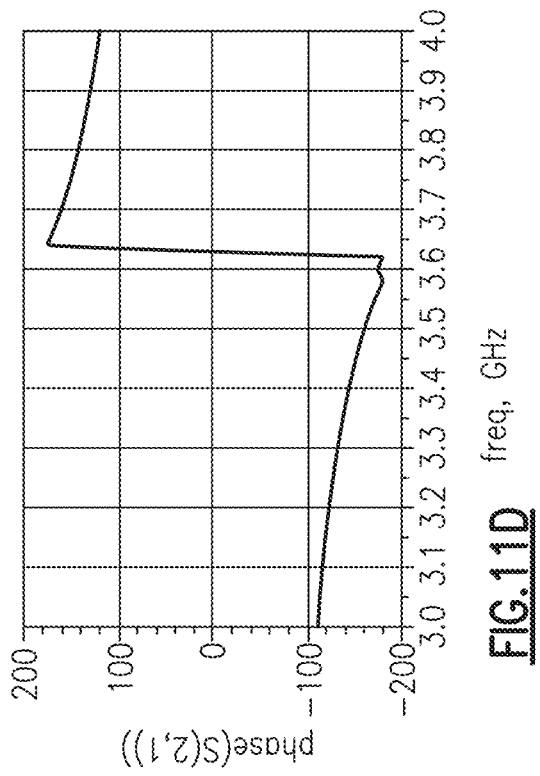
FIG. 11A is one example of a Smith chart of S11 for the multi-feed patch antenna of FIG. 10A.

FIG. 11A is one example of a Smith chart of S11 for the multi-feed patch antenna 500 of FIG. 10A. The Smith chart provides a graphical illustration of reflection coefficient at port P1 of the multi-feed patch antenna 500. The Smith chart was generated for a frequency sweep between 3 GHz and 4 GHz.

Figure 11B:
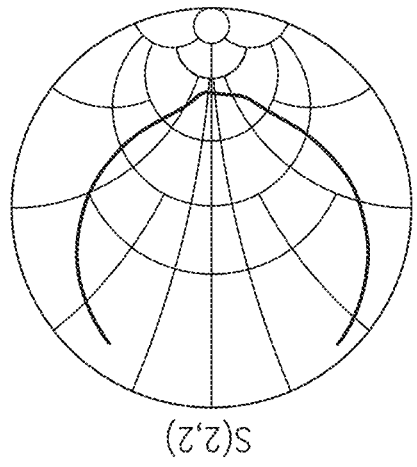
FIG. 11B is one example of a Smith chart of S22 for the multi-feed patch antenna of FIG. 10A.
Figure 11C:
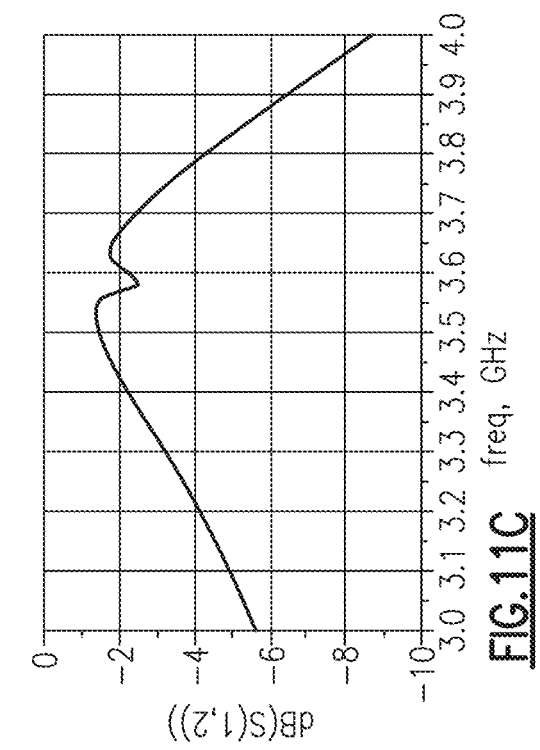
FIG. 11C is a graph of one example of isolation versus frequency for the multi-feed patch antenna of FIG. 10A.

FIG. 11B is one example of a Smith chart of S22 for the multi-feed patch antenna 500 of FIG. 10A. The Smith chart provides a graphical illustration of reflection coefficient at port P2 of the multi-feed patch antenna 500. The Smith chart was generated for a frequency sweep between 3 GHz and 6 GHz FIG. 11C is a graph of one example of isolation versus frequency for the multi-feed patch antenna 500 of FIG. 10A. The graph depicts forward transmission in dB versus frequency.

Figure 11D:
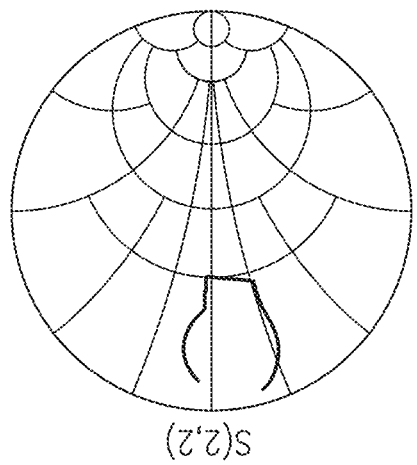
FIG. 11D is a graph of one example of phase shift versus frequency for the multi-feed patch antenna of FIG. 10A.

FIG. 11D is a graph of one example of phase shift versus frequency for the multi-feed patch antenna 500 of FIG. 10A. The graph depicts phase shift between port P1 and port P2.

Although various examples of simulation results have been shown, simulation results can vary based on a wide variety of factors, including, but not limited to, simulation parameters (including operating frequency), antenna models, and/or simulation tools.

Examples of Modules and Devices Applicable to Integrated Doherty Power Amplifiers Integrated Doherty power amplifiers can be implemented using a wide variety of modules, semiconductor dies, and/or other components. Furthermore, integrated Doherty power amplifiers can be included a wide variety of devices, including, but not limited to, mobile phones, tablets, base stations, network access points, customer-premises equipment (CPE), laptops, and wearable electronics. For example, modules, semiconductor dies, and/or other components can be included on circuit boards used in such devices.

Figure 12:
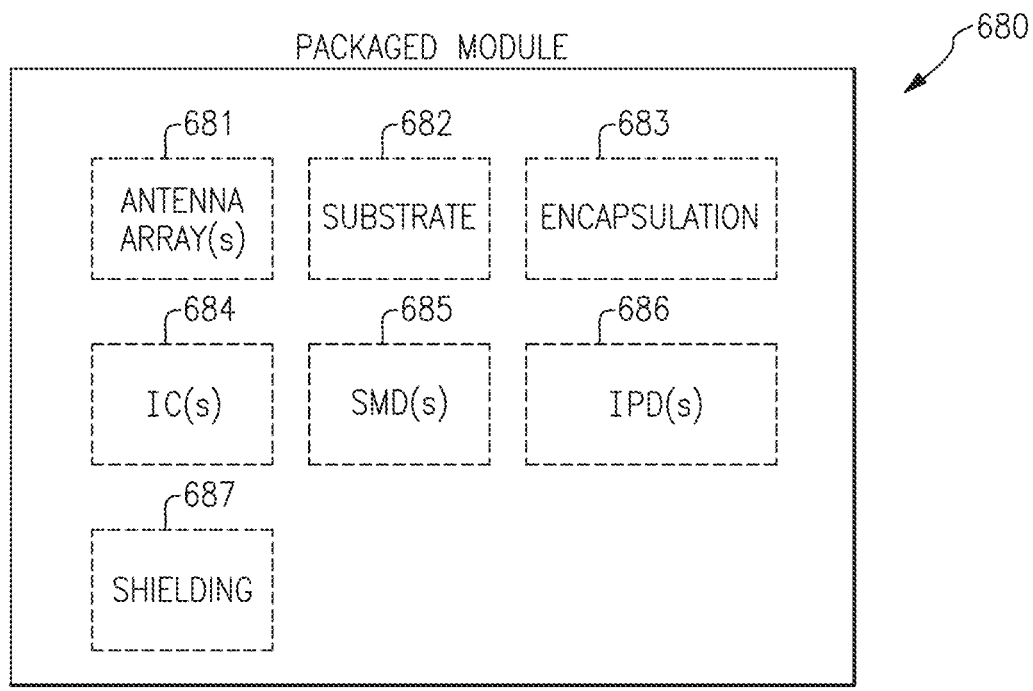
FIG. 12 is a schematic diagram of one embodiment of a module.

FIG. 12 is a schematic diagram of one embodiment of a module 680. The module 680 includes antenna array(s) 681, a substrate 682, encapsulation 683, IC(s) 684, surface mound device(s) or SMD(s) 685, integrated passive device(s) or IPD(s) 686, and shielding 687. The module 680 illustrates various examples of components and structures that can be included in a module of a communication device that includes one or more integrated Doherty power amplifiers.

Although one example of a combination of components and structures is shown, a module can include more or fewer components and/or structures.

Figure 13A:
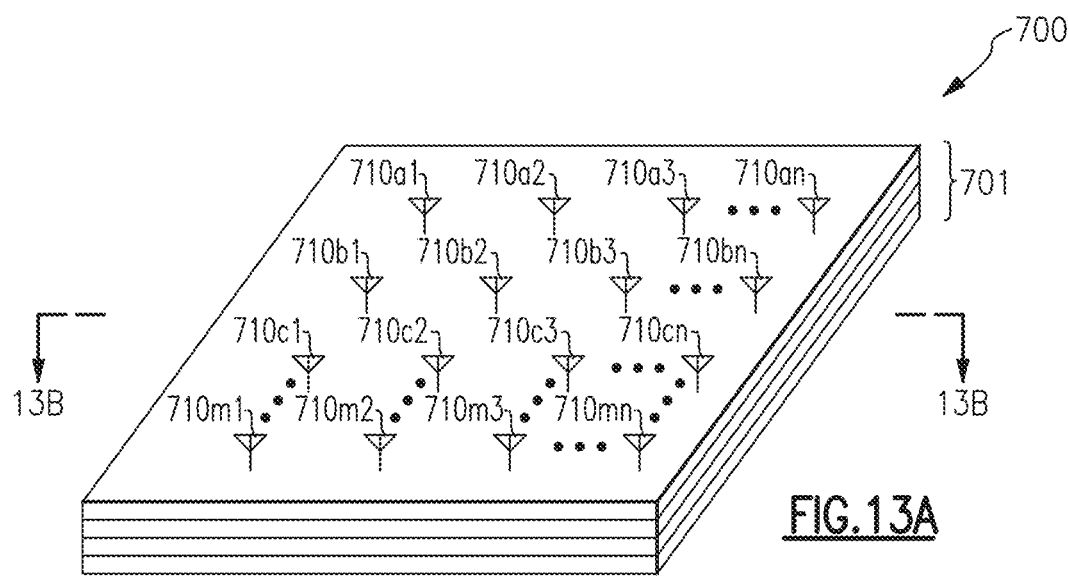
FIG. 13A is a perspective view of another embodiment of a module.
Figure 13B:
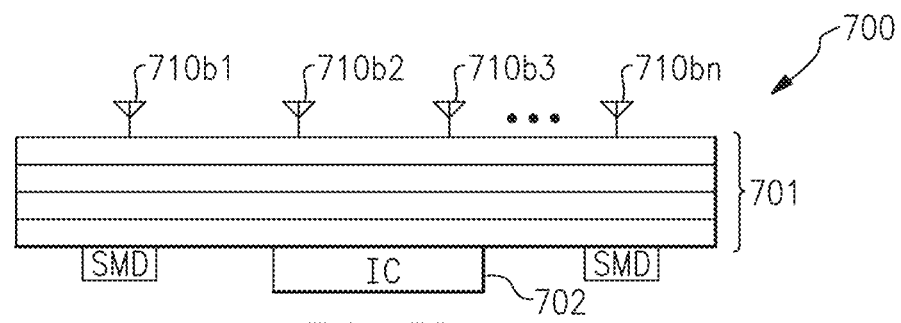
FIG. 13B is a cross-section of the module of FIG. 13A taken along the lines 13B-13B.

FIG. 13A is a perspective view of another embodiment of a module 700. FIG. 13B is a cross-section of the module 700 of FIG. 13A taken along the lines 13B-13B.

The module 700 includes a laminated substrate or laminate 701, a semiconductor die or IC 702 (not visible in FIG. 13A), SMDs (not visible in FIG. 13A), and an antenna array including antenna elements $710a1, 710a2, 710a3 \ldots 710an$, $710b1, 710b2, 710b3 \ldots 710bn, 710c1, 710c2, 710c3 \ldots 710cn, 710m1, 710m2, 710m3 \ldots 710mn$.

Although not shown in FIGS. 13A and 13B, the module 700 can include additional structures and components that have been omitted from the figures for clarity. Moreover, the module 700 can be modified or adapted in a wide variety of ways as desired for a particular application and/or implementation.

The antenna elements antenna elements 710*a*1, 710*a*2, 710*a*3 ... 710*an*, 710*b*1, 710*b*2, 710*b*3 ... 710*bn*, 710*c*1, 710*c*2, 710*c*3 ... 710*cn*, 710*m*1, 710*m*2, 710*m*3 ... 710*mn* are formed on a first surface of the laminate 701, and can be used to receive and/or transmit signals, based on implementation. Although a 4×4 array of antenna elements is shown, more or fewer antenna elements are possible as indicated by ellipses. Moreover, antenna elements can be arrayed in other patterns or configurations, including, for instance, arrays using non-uniform arrangements of antenna elements. Furthermore, in another embodiment, multiple antenna arrays are provided, such as separate antenna arrays for transmit and receive.

In the illustrated embodiment, the IC 702 is on a second surface of the laminate 701 opposite the first surface. However, other implementations are possible. In one example, the IC 702 is integrated internally to the laminate 701.

In certain implementations, the IC 702 includes one or more integrated Doherty power amplifiers associated with one or more of the antenna elements 710*a*1, 710*a*2, 710*a*3 ... 710*an*, 710*b*1, 710*b*2, 710*b*3 ... 710*bn*, 710*c*1, 710*c*2, 710*c*3 ... 710*cn*, 710*m*1, 710*m*2, 710*m*3 ... 710*mn*. Although an implementation with one semiconductor chip is shown, the teachings herein are applicable to implementations with additional chips.

The laminate 701 can include various structures including, for example, conductive layers, dielectric layers, and/or solder masks. The number of layers, layer thicknesses, and materials used to form the layers can be selected based on a wide variety of factors, and can vary with application and/or implementation. The laminate 701 can include vias for providing electrical connections to signal feeds and/or ground feeds of the antenna elements. For example, in certain implementations, vias can aid in providing electrical connections between Doherty power amplifiers of the IC 702 and corresponding antenna elements.

The antenna elements 710*a*1, 710*a*2, 710*a*3 ... 710*an*, 710*b*1, 710*b*2, 710*b*3 ... 710*bn*, 710*c*1, 710*c*2, 710*c*3 ... 710*cn*, 710 *m*1, 710*m*2, 710*m*3 ... 710*mn* can correspond to antenna elements implemented in a wide variety of ways. In one example, the array of antenna elements includes patch antenna elements formed from a patterned conductive layer on the first side of the laminate 701, with a ground plane formed using a conductive layer on opposing side of the laminate 701 or internal to the laminate 701. Other examples of antenna elements include, but are not limited to, dipole antenna elements, ceramic resonators, stamped metal antennas, and/or laser direct structuring antennas.

Figure 14:
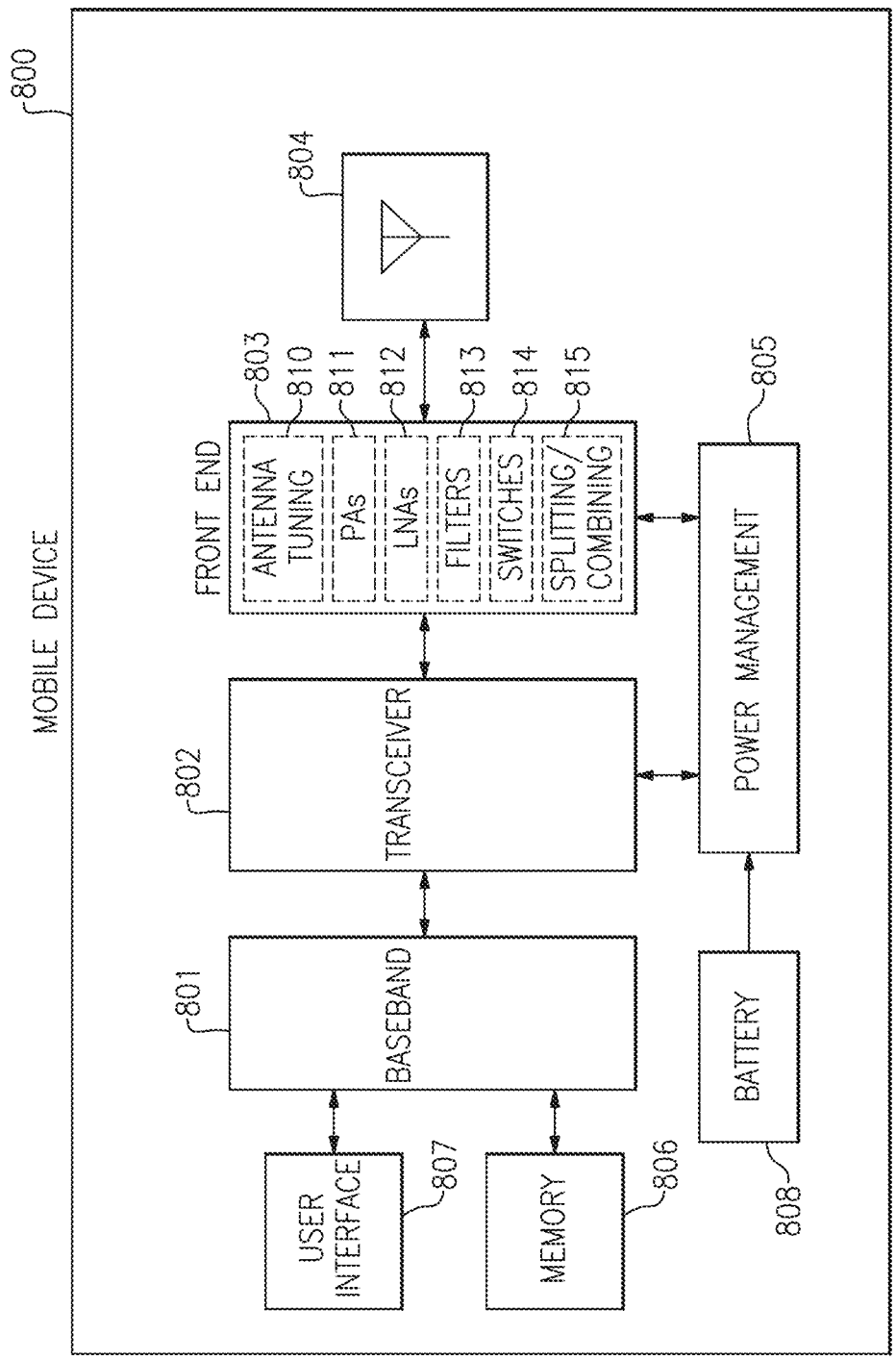
FIG. 14 is a schematic diagram of one embodiment of a mobile device.

FIG. 14 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 14 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. One or more of the power amplifiers 811 can be implemented as an integrated Doherty power amplifier in accordance with the teachings herein. Although one example of front end components is shown, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 14, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 14, the power management system 805 receives a battery voltage from the battery 808. The battery 808 can be any suitable battery for use in the mobile device 800, including, for example, a lithium-ion battery.

Figure 15:
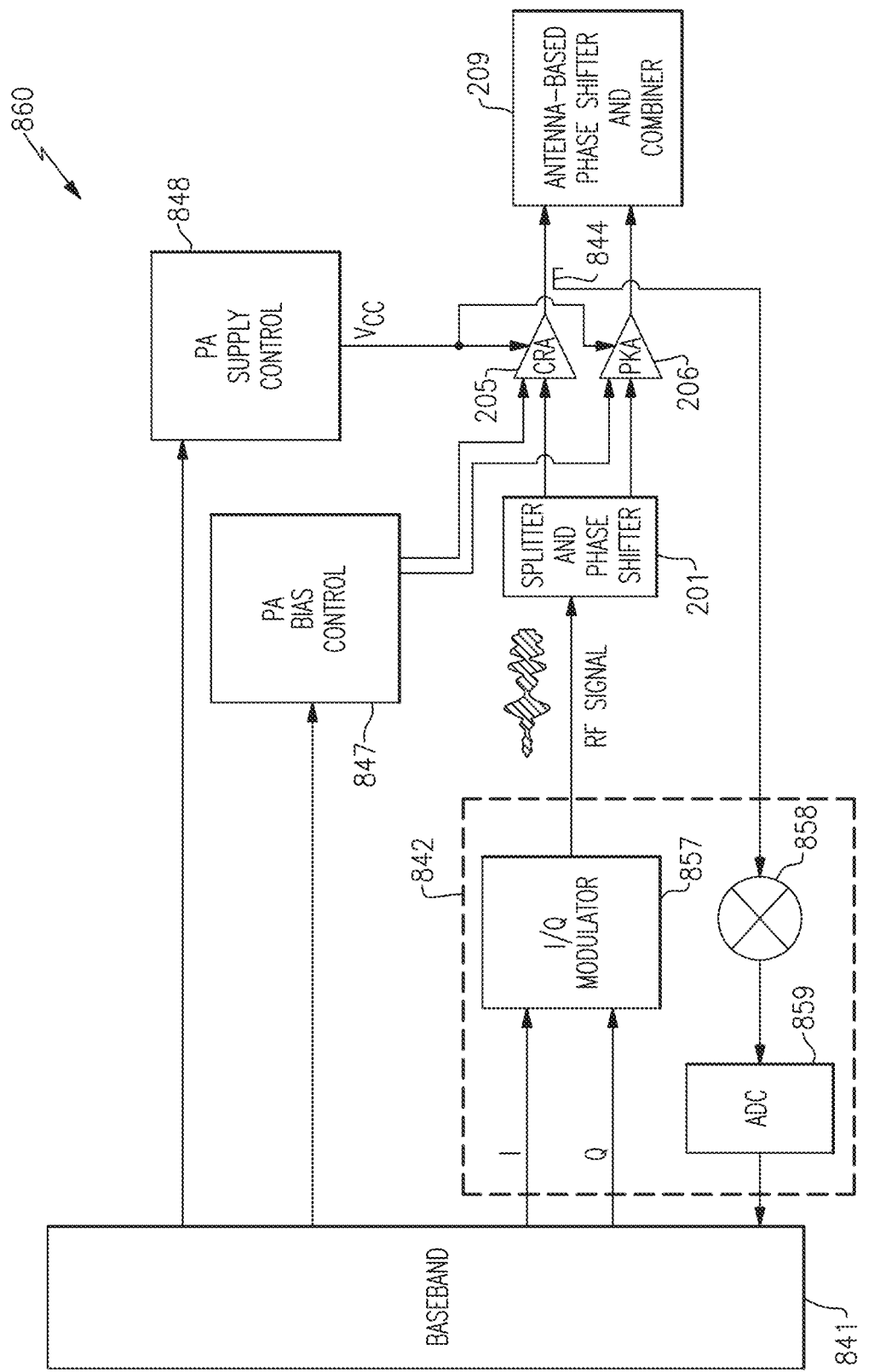
FIG. 15 is a schematic diagram of a power amplifier system according to one embodiment.

FIG. 15 is a schematic diagram of a power amplifier system 860 according to one embodiment. The illustrated power amplifier system 860 includes a baseband processor 841, a transmitter/observation receiver 842, a splitter and phase shifter 201, a carrier amplification stage 205, a peaking amplification stage 206, an antenna-based phase shifter and combiner 209, a directional coupler 844, a PA bias control circuit 847, and a PA supply control circuit 848. The illustrated transmitter/observation receiver 842 includes an I/O modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/O modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/O modulator 857 can be configured to receive the I and Q signals from the baseband processor 841 and to process the I and Q signals to generate an RF input signal. For example, the I/O modulator 857 can include digital-to-analog converters (DACs) configured to convert the I and Q signals into an analog format, mixers for upconverting the I and Q signals to RF, and a signal combiner for combining the upconverted I and Q signals into an RF input signal. In certain implementations, the I/O modulator 857 can include one or more filters configured to filter frequency content of signals processed therein.

The splitter and phase shifter 201 receives the RF input signal from the I/O modulator 857, and generates a first RF signal for the carrier amplification stage 205 and a second RF signal for the peaking amplification stage 206.

In the illustrated embodiment, the directional coupler 844 senses an output signal of the carrier amplification stage 205. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841.

Including a feedback path from the output of one or more amplification stages of a Doherty power amplifier to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a Doherty power amplifier is shown, other implementations are possible. For instance, in another example, a multiplexed sensing path or separate sensing paths are provided for the carrier amplification stage 205 and the peaking amplification stage 206.

The PA supply control circuit 848 receives a power control signal from the baseband processor 841, and controls the power amplifier supply voltage $V_{CC}$ provided to the carrier amplification stage 205 and the peaking amplification stage 206. The PA supply control circuit 848 can control the voltage level of the power amplifier supply voltage $V_{CC}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF input signal. Thus, when a voltage level of the envelope of the RF input signal increases the voltage level of the power amplifier's supply voltage can be increased. Likewise, when the voltage level of the envelope of the RF input signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 15, the PA bias control circuit 847 receives a bias control signal from the baseband processor 841, and generates a first bias signal for the carrier amplification stage 205 and a second bias signal for the peaking amplification stage 206. In certain implementations, the carrier amplification stage 205 is enabled over a wide range of power levels while the peaking amplification stage 206 is selectively enabled (for instance, by class C bias circuitry of the PA bias control circuit 847) at high power levels.

Figure 16A:
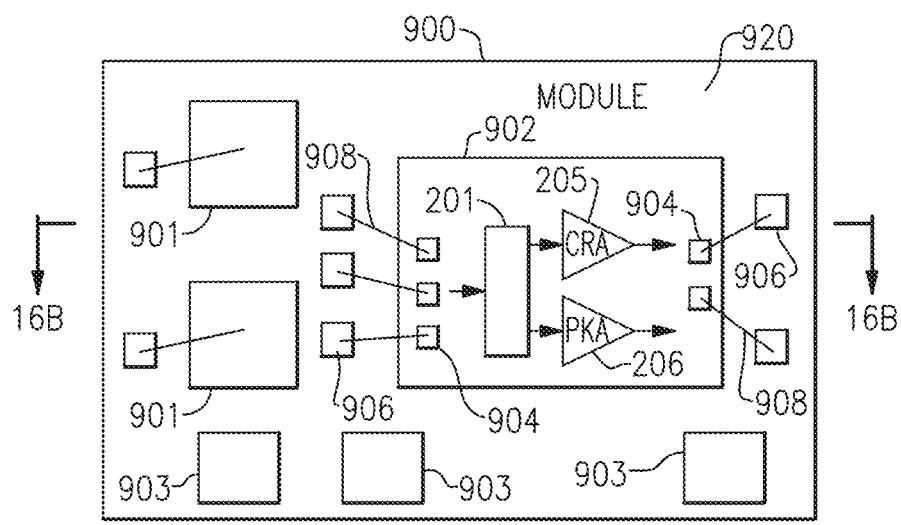
FIG. 16A is a schematic diagram of another embodiment of a module.
Figure 16B:
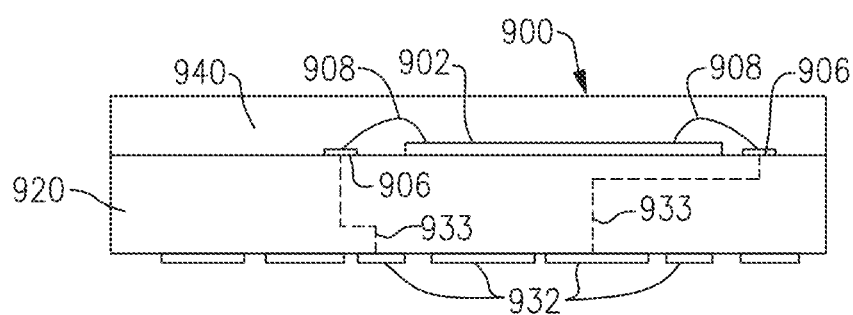
FIG. 16B is a schematic diagram of a cross-section of the module of FIG. 16A taken along the lines 16B-16B.

FIG. 16A is a schematic diagram of another embodiment of a module 900. FIG. 16B is a schematic diagram of a cross-section of the module 900 of FIG. 16A taken along the lines 16B-16B.

The module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a splitter and phase shifter 201, a carrier amplification stage 205, and a peaking amplification stage 206, which can be implemented in accordance with one or more features disclosed herein. In certain implementations, an antenna-based phase shifter and combiner or other antenna structure is attached to the packaging substrate 920, and receives a carrier signal from the carrier amplification stage 205 and a peaking signal from the peaking amplification stage 206.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 16B, the module 900 is shown to include a plurality of contact pads 932 disposed on the side of the module 900 opposite the side used to mount the semiconductor die 902. Configuring the module 900 in this manner can aid in connecting the module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 16B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the module 900 is described in the context of electrical connections based on wirebonds, one or more features of the present disclosure can also be implemented in other packaging configurations, including, for example, flip-chip configurations.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency antenna structure comprising:
a patch antenna element;
a ground plane that extends at least in part beneath the patch antenna element;
an impedance transformer having a feed conductor coupled to the patch antenna element;
a first input conductor extending from the feed conductor and including a first port that receives a carrier signal; and
a second input conductor extending from the feed conductor and including a second port that receives a peaking signal.

2. The radio frequency antenna structure of claim 1 further comprising a substrate that includes the patch antenna element and the impedance transformer.

3. The radio frequency antenna structure of claim 2 wherein the impedance transformer is integrated under the patch antenna element.

4. The radio frequency antenna structure of claim 3 wherein the ground plan extends at least in part beneath the impedance transformer.

5. The radio frequency antenna structure of claim 1 wherein the feed conductor is electromechanically coupled to the patch antenna element.

6. The radio frequency antenna structure of claim 1 further wherein the feed conductor is coupled to the patch antenna element by fields without a direct electrical connection.

7. The radio frequency antenna structure of claim 1 wherein the impedance transformer provides output matching to a carrier amplification stage.

8. The radio frequency antenna structure of claim 1 wherein the impedance transformer provides output matching to a peaking amplification stage.

9. The radio frequency antenna structure of claim 1 wherein impedance transformations provided to the first and second ports is controlled by dimensions of the first and second input conductors.

10. The radio frequency antenna structure of claim 1 wherein a quarter wave impedance transformation between about 25 Ohm to 377 Ohm is provided at the first port.

11. A mobile device comprising:
a transceiver configured to generate a radio frequency input signal; and
an antenna structure that includes a patch antenna element, a ground plane that extends at least in part beneath the patch antenna element, and an impedance transformer having a feed conductor coupled to the patch antenna element, a first input conductor extending from the feed conductor and including a first port that receives a carrier signal, and a second input conductor extending from the feed conductor and including a second port that receives a peaking signal.

12. The mobile device of claim 11 further comprising a substrate that includes the patch antenna element and the impedance transformer.

13. The mobile device of claim 12 wherein the impedance transformer is integrated under the patch antenna element.

14. The mobile device of claim of claim 13 wherein the ground plan extends at least in part beneath the impedance transformer.

15. The mobile device of claim 11 wherein the feed conductor is electromechanically coupled to the patch antenna element.

16. The mobile device of claim 11 wherein the feed conductor is coupled to the patch antenna element by fields without a direct electrical connection.

17. The mobile device of claim 11 wherein the impedance transformer provides output matching to a carrier amplification stage.

18. The mobile device of claim 11 wherein the impedance transformer provides output matching to a peaking amplification stage.

19. The mobile device of claim of claim 11 wherein impedance transformations provided to the first and second ports is controlled by dimensions of the first and second input conductors.

20. The mobile device of claim 11 wherein a quarter wave impedance transformation between about 25 Ohm to 377 Ohm is provided at the first port.

* * * * *